(12) United States Patent
Seno et al.

(10) Patent No.: US 11,038,071 B2
(45) Date of Patent: Jun. 15, 2021

(54) SOLAR CELL, SOLAR CELL MODULE, AND METHOD FOR MANUFACTURING SOLAR CELL

(71) Applicant: PANASONIC INTELLECTUAL PROPERTY MANAGEMENT CO., LTD., Osaka (JP)

(72) Inventors: Minato Seno, Osaka (JP); Hiroyuki Yamada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 61 days.

(21) Appl. No.: 16/368,662

(22) Filed: Mar. 28, 2019

(65) Prior Publication Data

US 2019/0221684 A1 Jul. 18, 2019

Related U.S. Application Data

(63) Continuation of application No. PCT/JP2017/034056, filed on Sep. 21, 2017.

(30) Foreign Application Priority Data

Sep. 30, 2016 (JP) .............................. JP2016-195006

(51) Int. Cl.
*H01L 31/0236* (2006.01)
*H01L 31/20* (2006.01)
(Continued)

(52) U.S. Cl.
CPC .. *H01L 31/02363* (2013.01); *H01L 31/02167* (2013.01); *H01L 31/02168* (2013.01);
(Continued)

(58) Field of Classification Search
None
See application file for complete search history.

(56) References Cited

U.S. PATENT DOCUMENTS

2004/0221887 A1* 11/2004 Kondo ................. H01L 31/076
136/255
2013/0186459 A1* 7/2013 Kim .................... H01L 31/1804
136/256
2015/0372166 A1 12/2015 Tsunomura et al.

FOREIGN PATENT DOCUMENTS

JP 2014-011198 A 1/2014
WO 2014/155833 A1 10/2014

OTHER PUBLICATIONS

International Search Report and Written Opinion dated Nov. 7, 2017, in International Application No. PCT/JP2017/034056; with partial English translation.

* cited by examiner

*Primary Examiner* — Tamir Ayad
(74) *Attorney, Agent, or Firm* — McDermott Will and Emery LLP

(57) ABSTRACT

A solar cell includes: a silicon substrate including a texture structure in a first principal surface; and a first non-crystalline silicon layer formed on the first principal surface of the silicon substrate and including recesses and protrusions reflecting the texture structure. At a valley portion in the recesses and protrusions, the first non-crystalline silicon layer includes, in the stated order: a first epitaxial layer including a crystalline region epitaxially grown on the silicon substrate; a first amorphous layer which is a non-crystalline silicon layer; and a second amorphous layer which is a non-crystalline silicon layer. The density of the first amorphous layer is less than the density of the second amorphous layer.

10 Claims, 10 Drawing Sheets

(51) Int. Cl.
*H01L 31/0747* (2012.01)
*H01L 31/0216* (2014.01)

(52) U.S. Cl.
CPC ........ *H01L 31/0747* (2013.01); *H01L 31/202* (2013.01); *Y02E 10/50* (2013.01)

FIG. 9

| | NON-CRYSTALLINE LAYER FORMING PROCESS | | | |
|---|---|---|---|---|
| | FIRST EPITAXIAL LAYER FORMING PROCESS | FIRST INTERMEDIATE LAYER FORMING PROCESS | FIRST PASSIVATION LAYER FORMING PROCESS | N-TYPE NON-CRYSTALLIN SILICON LAYER FORMING PROCESS |
| LAYER FORMATION SPEED (DENSITY) | MIDDLE (MIDDLE) | HIGH (LOW) | LOW (HIGH) | LOW (HIGH) |
| LAYER FORMATION TIME (THICKNESS) | MIDDLE (MIDDLE) | SHORT (THIN) | LONG (THICK) | LONG (THICK) |

SOLAR CELL, SOLAR CELL MODULE, AND METHOD FOR MANUFACTURING SOLAR CELL

CROSS REFERENCE TO RELATED APPLICATIONS

This application is a U.S. continuation application of PCT International Patent Application Number PCT/JP2017/034056 filed on Sep. 21, 2017, claiming the benefit of priority of Japanese Patent Application Number 2016-195006 filed on Sep. 30, 2016, the entire contents of which are hereby incorporated by reference.

BACKGROUND

1. Technical Field

The present disclosure relates to solar cells, solar cell modules including solar cells, and methods for manufacturing solar cells.

2. Description of the Related Art

There has been advancement of the development of solar cells and solar cell modules including solar cells as photoelectric conversion devices which convert light energy into electrical energy. Solar cells and solar cell modules including solar cells are expected to become a new energy source due to the ability to directly convert sunlight, which is inexhaustible, into electricity, as well as due to being a clean solution with less environmental load than fossil fuel power generation.

A solar cell includes, in a light-receiving surface, recesses and protrusions called a texture structure in which pyramids are arranged in a matrix, to reduce the occurrence of light reflected off the light-receiving surface of the solar cell exiting a solar cell module including the solar cell. Accordingly, an increased amount of light enters the solar cell, and thus the power generation efficiency of the solar cell improves, which is common knowledge.

For example, International Publication WO2014/155833 A1 discloses a solar cell which includes: a silicon substrate including the texture structure in a light-receiving surface of the solar cell; and a non-crystalline silicon layer provided on a surface of the silicon substrate and in which an epitaxial growth region (crystalline region) in the non-crystalline silicon layer is thicker at a valley portion than at a slant portion in a cross-sectional view.

SUMMARY

It is, however, difficult to control the thickness of the epitaxial growth region. When the texture structure is miniaturized (reduced in diameter), the occupancy of the epitaxial growth region in the non-crystalline silicon layer increases. With this, the fill factor (FF) of the solar cell increases, but the open circuit voltage (Voc) decreases.

In view of this, an object of the present disclosure is to provide a solar cell, etc., capable of maintaining a high fill factor and a high open circuit voltage even when the solar cell has a miniaturized texture structure.

In order to achieve the aforementioned object, a solar cell according to one aspect of the present disclosure includes: a silicon substrate including, in a first principal surface, a texture structure in which a plurality of pyramids are arranged in a matrix; and a first non-crystalline silicon layer on the first principal surface of the silicon substrate. The first non-crystalline silicon layer includes recesses and protrusions reflecting the texture structure. At a valley portion in the recesses and protrusions, the first non-crystalline silicon layer includes, in stated order: a first epitaxial layer including a crystalline region epitaxially grown on the silicon substrate; a first amorphous layer which is a non-crystalline silicon layer on the first epitaxial layer; and a second amorphous layer which is a non-crystalline silicon layer on the first amorphous layer. The first amorphous layer has a density less than a density of the second amorphous layer.

A solar cell module according to one aspect of the present disclosure includes a plurality of solar cells each of which is the above-described solar cell.

A method for manufacturing a solar cell according to one aspect of the present disclosure includes forming, on a first principal surface of a silicon substrate including a texture structure, a first non-crystalline silicon layer including recesses and protrusions reflecting the texture structure, by chemical vapor deposition using a raw material gas containing silicon. The forming of the first non-crystalline silicon layer includes: forming a first epitaxial layer including a crystalline region formed on the silicon substrate and epitaxially grown; forming a first amorphous layer which is a non-crystalline silicon layer on the first epitaxial layer; and forming a second amorphous layer which is a non-crystalline silicon layer on the first amorphous layer. A layer formation speed in the forming of the first amorphous layer is greater than a layer formation speed in the forming of the second amorphous layer.

With the solar cell, etc., according to an embodiment of the present disclosure, a high fill factor and a high open circuit voltage can be maintained.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 9 is a diagram illustrating layer forming conditions for forming a non-crystalline silicon layer according to Embodiment 1.

DETAILED DESCRIPTION OF THE EMBODIMENTS

Figure 1:
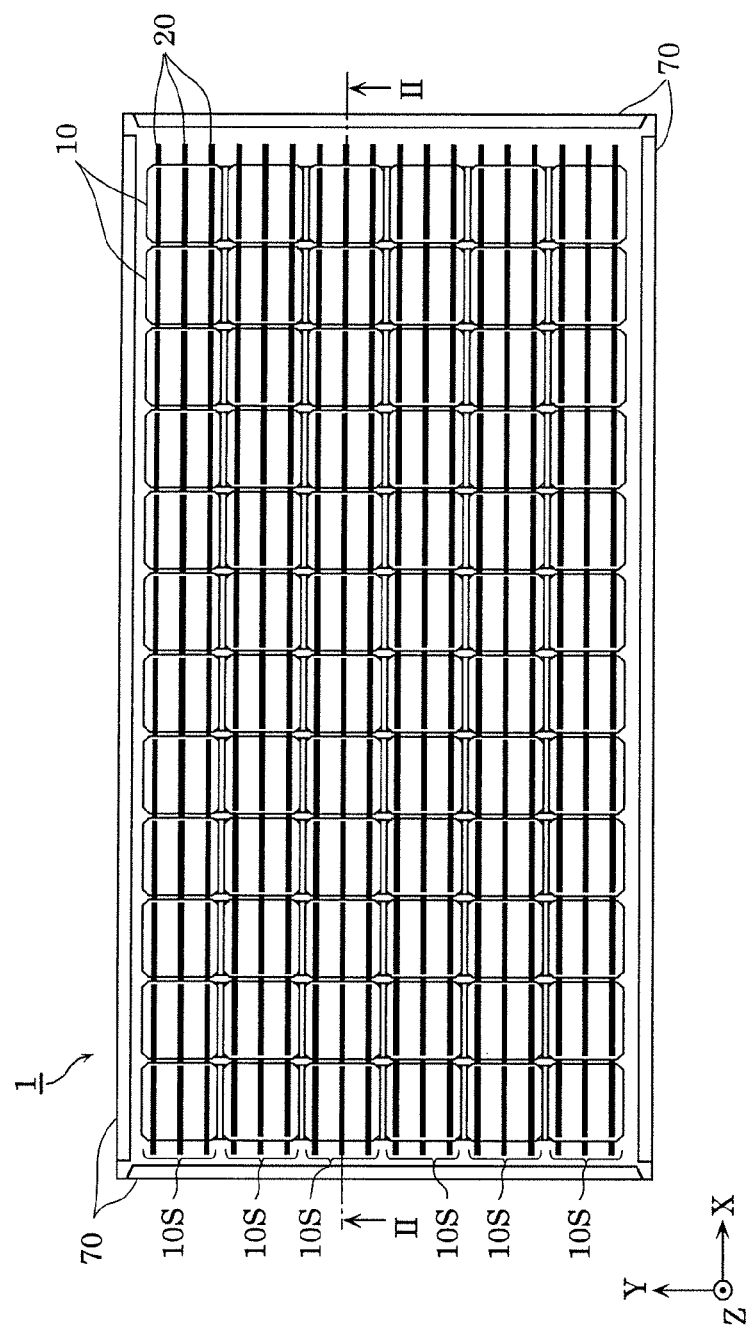
FIG. 1 is a plan view of a solar cell module according to Embodiment 1.

Developments that Resulted in the Present Disclosure

As described earlier, the recesses and protrusions called the texture structure are formed in the silicon substrate of the solar cell, and the non-crystalline silicon layer is formed on the texture structure. The non-crystalline silicon layer includes: a non-crystalline region (amorphous region) which is a main structural element of the non-crystalline silicon layer; and an epitaxial growth region (crystalline region). In the recesses and protrusions, the non-crystalline silicon layer is formed so that the epitaxial growth region (crystalline region) at the valley portion is thicker than the epitaxial growth region at the slant portion.

The epitaxial growth region exhibits better electrical conductivity than the non-crystalline region. Therefore, as the occupancy of the epitaxial growth region in the non-crystalline silicon layer increases, the resistance loss is reduced and thus, the fill factor (FF) increases. It is, however, problematic that when the occupancy of the epitaxial growth region in the non-crystalline silicon layer increases, the open circuit voltage (Voc) decreases. When the occupancy of the non-crystalline region increases, the open circuit voltage increases, but the resistance loss increases and thus, the fill factor decreases.

The recesses and protrusions in the silicon substrate may need to be miniaturized (reduced in diameter) from the perspective of power generation efficiency. It is, however, difficult to control the thickness of the epitaxial growth region in the non-crystalline silicon layer, and if the texture structure is miniaturized, the occupancy of the epitaxial growth region in the non-crystalline silicon layer increases. With this, the passivation effect of the non-crystalline silicon layer is reduced, and thus the open circuit voltage of the solar cell decreases. In other words, the power generation efficiency decreases.

Generally, when the layer formation speed is reduced, the formed layer has improved quality (becomes dense), and thus the passivation effect of the non-crystalline silicon layer improves. However, if the layer formation speed is reduced to form a non-crystalline silicon layer having a high passivation effect, the susceptibility to the crystal orientation of the silicon substrate at the time of layer formation increases, which promotes epitaxial growth. In short, when the layer formation speed is reduced, the passivation effect of the non-crystalline silicon layer decreases. When the layer formation speed is increased, the epitaxial growth region is not formed. This means that in the non-crystalline silicon layer, it is difficult to produce a high passivation effect and accurately control the thickness of the epitaxial growth region.

In view of this, the inventors of the present disclosure considered if the aforementioned problem can be solved by forming, separately in layers, an epitaxial layer including an epitaxial growth region and an amorphous layer (first passivation layer) having a high passivation effect. When the first passivation layer is formed directly on the epitaxial layer, the first passivation layer undergoes epitaxial growth under the influence of the crystalline region of the epitaxial layer. This means that the first passivation layer fails to have a high passivation effect.

As a solution, the inventors found that when an amorphous layer (first intermediate layer) having no epitaxial growth region is provided between the epitaxial layer and the first passivation layer, the first passivation layer having a high passivation effect can be formed. In other words, the first intermediate layer serves as an undercoat layer provided to protect the first passivation layer from the impact of the crystalline region of the epitaxial layer, and is used to inhibit epitaxial growth (epitaxial growth inhibition layer).

With this, it is possible to adjust the fill factor by controlling the thickness of the epitaxial layer including the epitaxial growth region. The thickness of the epitaxial layer can be adjusted by management for time in which the layer is formed, for example. Thus, the thickness of the epitaxial layer, in other words, the fill factor, can be controlled by easy management such as management of time in which the layer is formed.

Furthermore, when the first intermediate layer which inhibits epitaxial growth is provided between the epitaxial layer and the first passivation layer, the first passivation layer can be formed on the first intermediate layer without being affected by the epitaxial layer. Since it is possible to avoid the impact of the epitaxial layer during the layer formation, the layer formation speed at which the first passivation layer is formed can be reduced. With this, the quality of the first passivation layer improves. In other words, the first passivation layer having a high passivation effect can be formed. Thus, the open circuit voltage can be increased. Consequently, even when the recesses and protrusions of the texture structure are miniaturized, a high fill factor and a high open circuit voltage can be maintained.

Hereinafter, a solar cell, a solar cell module including a solar cell, and a method for manufacturing a solar cell according to one aspect of the present disclosure will be described.

Embodiments of the present disclosure will be described in detail below with reference to the drawings. Each of the embodiments described below shows a specific example of the present disclosure. Therefore, numerical values, shapes, materials, structural elements, the arrangement and connection of the structural elements, steps, etc., shown in the following embodiments are mere examples, and are not intended to limit the scope of the present disclosure. Therefore, among the structural elements in the following embodiments, structural elements not recited in any one of the independent claims defining the most generic concept of the present disclosure are described as arbitrary structural elements.

Furthermore, the respective figures are schematic diagrams and are not necessarily precise illustrations. In addition, in the respective figures, substantially identical elements are given the same reference signs, and overlapping explanation thereof will be omitted or simplified. For example, description of an embodiment below will focus on differences from an embodiment described before said embodiment. Furthermore, the term "substantially/approximately XX" is intended to encompass XX that is virtually recognized as XX; for example, "substantially parallel" is intended to encompass not only being perfectly parallel, but also being along a direction to be virtually recognized as parallel.

Furthermore, in the respective figures, the Z-axis is vertical and is perpendicular to the principal surface of the solar cell module and the principal surface (front surface) of the solar cell, for example. The X-axis and the Y-axis are orthogonal to each other and are both orthogonal to the Z-axis. For example, in the following embodiments, "plan view" means seeing along the Z-axis.

Embodiment 1

Hereinafter, Embodiment 1 will be described with reference to FIG. 1 to FIG. 9.

[1-1. Configuration of Solar Cell Module]

First, the outline configuration of a solar cell module according to the present embodiment will be described with reference to FIG. 1 and FIG. 2.

FIG. 1 is a plan view of solar cell module 1 according to the present embodiment. FIG. 2 is a cross-sectional view of solar cell module 1 taken along line II-II of FIG. 1.

Figure 2:
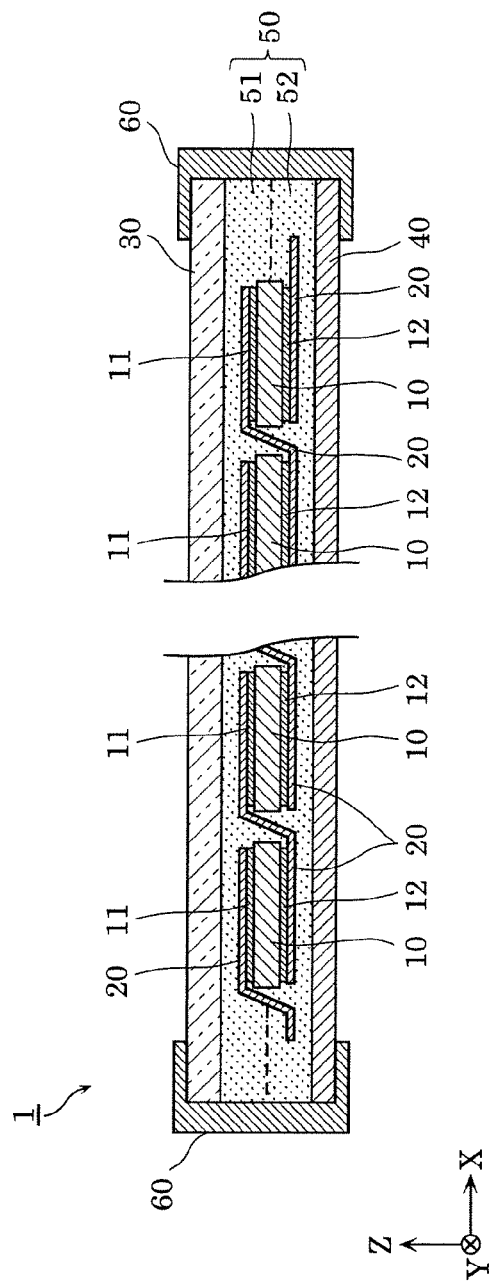
FIG. 2 is a cross-sectional view of a solar cell module taken along line II-II of FIG. 1.

As illustrated in FIG. 1 and FIG. 2, solar cell module 1 includes a plurality of solar cells 10, wiring member 20, front surface protection member 30, rear surface protection member 40, filling member 50, and frame 60. Solar cell module 1 has a configuration in which the plurality of solar cells 10 are sealed between front surface protection member 30 and rear surface protection member 40 using filling member 50.

As illustrated in FIG. 1, solar cell module 1 has a substantially rectangular shape in a plan view, for example.

Each of the structural elements of solar cell module 1 will be described in further detail with reference to FIG. 3 and FIG. 4 as well as FIG. 1 and FIG. 2.

[1-1-1. Solar Cell]

Solar cell 10 is a photoelectric conversion element (photovoltaic element) which converts light such as sunlight into electric power. As illustrated in FIG. 1, the plurality of solar cells 10 are arranged in rows and columns (in a matrix) on the same plane. Note that solar cells 10 may be arranged in only a single row or column on the same plane.

The plurality of solar cells 10 arranged linearly form a string (cell string) as a result of adjacent two solar cells 10 being connected using wiring member 20. The plurality of solar cells 10 in one string 10S are electrically connected and connected in series using wiring member 20.

As illustrated in FIG. 1, in the present embodiment, 12 solar cells 10 arranged at equal intervals along the row (X-axis) are connected by wiring member 20 to form one string 10S. A plurality of strings 10S are formed. The plurality of strings 10S are arranged along the column (Y-axis). In the present embodiment, as illustrated in FIG. 1, six strings 10S are arranged parallel to each other at equal intervals along the column.

Note that each string 10S is connected to another wiring member (not illustrated in the drawings) via wiring member 20. With this, the plurality of strings 10S are connected in series or connected in parallel, and thus a cell array is formed. In the present embodiment, two adjacent strings 10S are connected in series to form one series connection body (an element obtained by connecting 24 solar cells 10 in series), and three series connection bodies are connected in series to form an element including 72 solar cells connected in series.

As illustrated in FIG. 1, the plurality of solar cells 10 are arranged in such a manner that solar cells 10 adjacent along the row and along the column have a gap therebetween. In this gap, for example, a light-reflecting member (not illustrated in the drawings) may be provided. When the light-reflecting member is provided, light incident on the gap area between solar cells 10 is reflected off a surface of the light-reflecting member. This reflected light is again reflected off an interface between front surface protection member 30 and a space exterior to solar cell module 1, and then is cast onto solar cell 10. Therefore, the incident photon-to-current conversion efficiency of entire solar cell module 1 can be improved.

Figure 3:
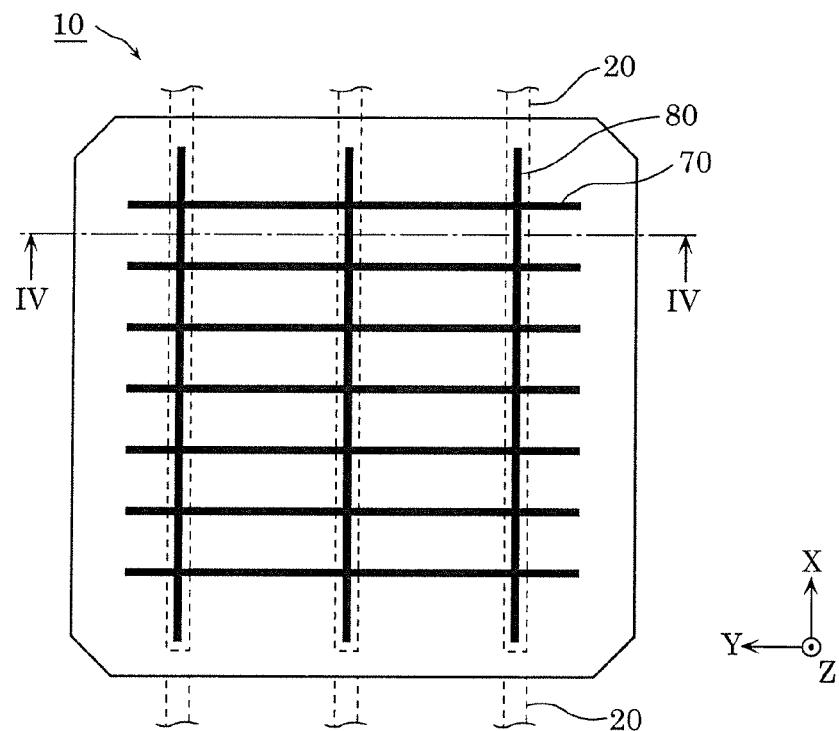
FIG. 3 is a plan view illustrating one example of a solar cell according to Embodiment 1.

FIG. 3 is a plan view illustrating one example of solar cell 10 according to the present embodiment. As illustrated in FIG. 3, in the present embodiment, solar cell 10 has a substantially rectangular shape in a plan view. For example, solar cell 10 is in the shape of a square having a size of 125 mm with rounded corners. In other words, one string 10S is configured in such a manner that adjacent two solar cells 10 have sides facing each other. Note that the shape of solar cell 10 is not limited to a substantially rectangular shape.

Figure 4:
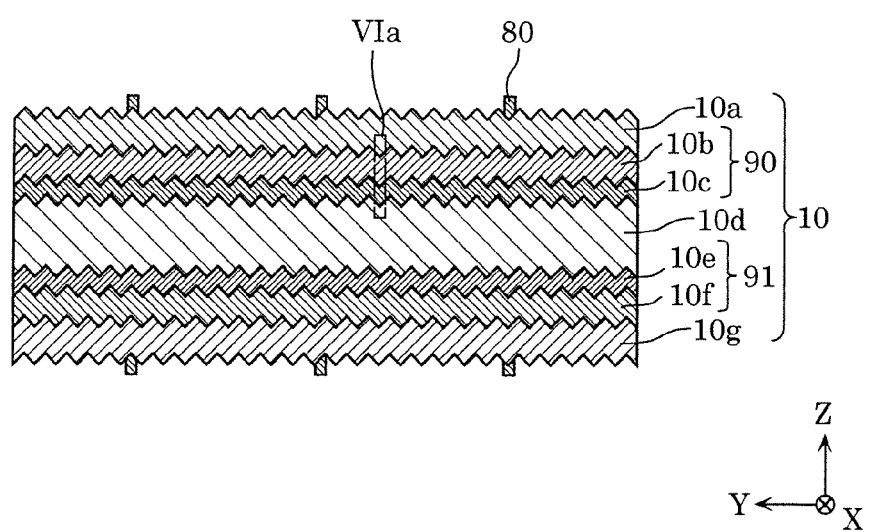
FIG. 4 is a cross-sectional view illustrating one example of a solar cell according to Embodiment 1.

FIG. 4 is a cross-sectional view illustrating one example of solar cell 10 according to the present embodiment. Specifically, FIG. 4 is a cross-sectional view of solar cell 10 taken along line IV-IV of FIG. 3. As illustrated in FIG. 4, solar cell 10 has a semiconductor p-n junction as a basic structure and includes, for example, n-type monocrystalline silicon substrate 10d which is an n-type semiconductor substrate; an n-type non-crystalline silicon layer 10b and n-side electrode 10a sequentially formed on the side of one principal surface of n-type monocrystalline silicon substrate 10d; and a p-type non-crystalline silicon layer 10f and p-side electrode 10g sequentially formed on the side of the other principal surface of n-type monocrystalline silicon substrate 10d. Each of n-side electrode 10a and p-side electrode 10g is, for example, a transparent electrode made from indium tin oxide (ITO) or the like. Furthermore, i-type non-crystalline silicon layer 10c which is a passivation layer is provided between n-type monocrystalline silicon substrate 10d and n-type non-crystalline silicon layer 10b, and i-type non-crystalline silicon layer 10e which is a passivation layer is provided between n-type monocrystalline silicon substrate 10d and p-type non-crystalline silicon layer 10f. In other words, solar cell 10 is, for example, a heterojunction solar cell. As a result, defects in the interface between n-type monocrystalline silicon substrate 10d and n-type non-crystalline silicon layer 10b and the interface (heterojunction interface) between n-type monocrystalline silicon substrate 10d and p-type non-crystalline silicon layer 10f are reduced. Thus, the incident photon-to-current conversion efficiency of solar cell module 1 can be improved.

Note that the passivation layer is not limited to i-type non-crystalline silicon layer 10c, 10e and may be a silicon oxide layer or a silicon nitride layer or is not required. The crystalline silicon substrate included in solar cell 10 is not limited to a monocrystalline silicon substrate (n-type monocrystalline silicon substrate or p-type monocrystalline silicon substrate); it is sufficient that the crystalline silicon substrate included in solar cell 10 be a crystalline silicon substrate such as a polycrystalline silicon substrate (hereinafter referred to as a silicon substrate). In the following description, the case where the crystalline silicon substrate is an n-type monocrystalline silicon substrate will be described. Furthermore, the crystalline silicon substrate will be referred to simply as silicon substrate 10d.

In the present embodiment, the one principal surface of silicon substrate 10d is a surface (surface in the positive direction of the Z-axis) of silicon substrate 10d on the principal light-receiving surface side of solar cell module 1. The other principal surface of silicon substrate 10d is a surface (surface in the negative direction of the Z-axis) of silicon substrate 10d opposite to the one principal surface.

As illustrated in FIG. 4, recesses and protrusions called a texture structure are formed in the one principal surface (front surface) and the other principal surface (rear surface) of silicon substrate 10d. The one principal surface and the other principal surface each of which includes the texture structure are referred to as a first principal surface and a second principal surface, respectively. Furthermore, non-crystalline silicon layers 90, 91 and electrodes 10a, 10g formed on the first and second principal surfaces of silicon substrate 10d include recesses and protrusions reflecting the texture structure. Although the present embodiment describes an example in which each of the first and second principal surfaces of silicon substrate 10d includes the texture structure, this is not limiting. For example, only the first principal surface may include the aforementioned texture structure. The interface between silicon substrate 10d and the non-crystalline silicon layer will be described later.

Note that although the heterojunction solar cell is described above, solar cell 10 is not limited to the heterojunction solar cell. For example, solar cell 10 may be a crystalline silicon solar cell such as a monocrystalline silicon solar cell or a polycrystalline silicon solar cell. The thickness of silicon substrate 10d is, for example, 150 μm or less.

In the present embodiment, solar cell 10 is disposed so that n-side electrode 10a is located on the principal light-receiving surface side (front surface protection member 30 side) of solar cell module 1, but this is not limiting. For example, solar cell 10 may be disposed so that p-side electrode 10g is located on the principal light-receiving surface side of solar cell module 1. Furthermore, when solar cell module 1 is of the one-side light-reception type, an electrode located on the rear surface side (in the present embodiment, p-side electrode 10g) does not need to be transparent and may be, for example, a metal electrode having light-reflecting properties.

The front surface of each solar cell 10 is a front surface protection member 30-side surface, and the rear surface of each solar cell 10 is a rear surface protection member 40-side surface. As illustrated in FIG. 2, front surface collector 11 and rear surface collector 12 are formed on solar cell 10. Front surface collector 11 is electrically connected to a front surface side electrode (for example, n-side electrode 10a) of solar cell 10. Rear surface collector 12 is electrically connected to a rear surface side electrode (for example, p-side electrode 10g) of solar cell 10.

Each of front surface collector 11 and rear surface collector 12 includes, for example, a plurality of finger electrodes 70 linearly formed perpendicular to the extending direction of wiring member 20 and a plurality of bus bar electrodes 80 connected to finger electrodes 70 and linearly formed along a direction (the extending direction of wiring member 20) perpendicular to finger electrodes 70. The number of bus bar electrodes 80 is, for example, equal to the number of wiring members 20, which is three in the present embodiment. Although front surface collector 11 and rear surface collector 12 have the same shape, this is not limiting. Furthermore, as illustrated in FIG. 3, when front surface collector 11 is formed, wiring member 20 is joined to each of bus bar electrodes 80. A detailed description of wiring member 20 will be given later.

Each of front surface collector 11 and rear surface collector 12 is made from a low-resistance conductive material such as silver (Ag). For example, each of front surface collector 11 and rear surface collector 12 can be formed by screen printing, with a predetermined pattern, a conductive paste (such as silver paste) obtained by dispersing a conductive filler such as silver in a binder resin.

Both the front surface and the rear surface of solar cell 10 configured as described above serve as light-receiving surfaces. When light enters solar cell 10, carriers are generated in a photoelectric conversion unit of solar cell 10. The generated carriers are collected by front surface collector 11 and rear surface collector 12, and then flow into wiring members 20. Thus, as a result of providing front surface collector 11 and rear surface collector 12, the carriers generated in solar cell 10 can be efficiently retrieved by an external circuit.

[1-1-2. Wiring Member (Interconnector)]

As illustrated in FIG. 1 and FIG. 2, wiring member 20 (interconnector) is a tab wire of string 10S which electrically connects two adjacent solar cells 10 to each other. As illustrated in FIG. 1, in the present embodiment, two adjacent solar cells 10 are connected by three wiring members 20 arranged substantially parallel to each other. Each wiring member 20 extends along the arrangement of two solar cells 10 which said wiring member 20 connects. As illustrated in FIG. 2, regarding each wiring member 20, one end portion of wiring member 20 is disposed on the front surface of one of two adjacent solar cells 10, and the other end portion of wiring member 20 is disposed on the rear surface of the other of two adjacent solar cells 10. Each wiring member 20 electrically connects front surface collector 11 of one of two adjacent solar cells 10 and rear surface collector 12 of the other of two adjacent solar cells 10. For example, wiring member 20 and bus bar electrode 80 of each of front surface collector 11 and rear surface collector 12 of solar cell 10 are joined together by a resin adhesive material, an adhesive having electrical conductivity such as a solder material, or the like. In the case where wiring member 20 and bus bar electrode 80 of each of front surface collector 11 and rear surface collector 12 of solar cell 10 are joined together by a resin adhesive material, the resin adhesive material may contain conducting particles.

Wiring member 20 is an elongated conductive wire and is, for example, ribbon-shaped metal foil. Wiring member 20 can be fabricated, for example, by cutting, into strips having a predetermined length, metal foil such as copper foil or silver foil having the entire surface coated with solder, silver, or the like.

[1-1-3. Front Surface Protection Member, Rear Surface Protection Member]

Front surface protection member 30, which is used to protect the frontal surface of solar cell module 1, protects the interior (such as solar cells 10) of solar cell module 1 against the external environment such as wind and rain and external impact. As illustrated in FIG. 2, front surface protection member 30 is provided on the front surface side of solar cell 10 and protects the front surface-side light-receiving surface of solar cell 10.

Front surface protection member 30 is configured using a light-transmissive member which transmits light having a wavelength used for photoelectric conversion in solar cell 10. For example, front surface protection member 30 is a glass substrate (transparent glass substrate) made from a transparent glass material, or a resin substrate made from a light-transmissive, impervious hard resin material having the shape of a film, a board, or the like.

Rear surface protection member 40, which is used to protect the back surface of solar cell module 1, protects the interior of solar cell module 1 against the external environment. As illustrated in FIG. 2, rear surface protection member 40 is provided on the rear surface side of solar cell 10 and protects the rear surface-side light-receiving surface of solar cell 10.

Rear surface protection member 40 is, for example, a resin sheet made from a resin material such as polyethylene terephthalate (PET) or polyethylene naphthalate (PEN) and having the shape of a film, a board, or the like.

In the case where solar cell module 1 is of the one-side light-reception type, rear surface protection member 40 may be an opaque board or film. Note that rear surface protection member 40 is not limited to an opaque member and may be a light-transmissive member such as sheet glass or a glass substrate made from a glass material.

[1-1-4. Filling Member]

Filling member 50 fills the gap between front surface protection member 30 and rear surface protection member 40. Front surface protection member 30, rear surface protection member 40, and solar cell 10 are bonded and secured by filling member 50. In the present embodiment, filling member 50 is loaded to fill the gap between front surface protection member 30 and rear surface protection member 40.

As illustrated in FIG. 2, filling member 50 includes front surface filling member 51 and rear surface filling member 52. Each of front surface filling member 51 and rear surface filling member 52 covers the plurality of solar cells 10 arranged in a matrix.

As a result of performing a lamination process (laminating) while the plurality of solar cells 10 are sandwiched between sheet-like front surface filling member 51 and rear surface filling member 52, for example, the entirety of the plurality of solar cells 10 is covered by filling member 50.

Specifically, string 10S is formed by connecting the plurality of solar cells 10 using wiring members 20, and then the plurality of strings 10S are sandwiched between front surface filling member 51 and rear surface filling member 52; furthermore, front surface protection member 30 and rear surface protection member 40 are disposed above front surface filling member 51 and below rear surface filling member 52, respectively, and thermocompression bonding is performed in a vacuum, for example, at a temperature of at least 100° C. Through this thermocompression bonding, front surface filling member 51 and rear surface filling member 52 are heated and melted, resulting in filling member 50 which seals solar cells 10.

Surface filling member 51 before the lamination process is, for example, a resin sheet made from a resin material such as ethylene-vinyl acetate (EVA) or polyolefin, and is disposed between the plurality of solar cells 10 and front surface protection member 30. Through the lamination process, front surface filling member 51 is loaded to mainly fill the gap between solar cells 10 and front surface protection member 30.

Front surface filling member 51 is configured using a light-transmissive material. In the present embodiment, as front surface filling member 51 before the lamination process, a transparent resin sheet made from EVA is used.

Rear surface filling member 52 before the lamination process is, for example, a resin sheet made from a resin material such as EVA or polyolefin, and is disposed between the plurality of solar cells 10 and rear surface protection member 40. Through the lamination process, rear surface filling member 52 is loaded to mainly fill the gap between solar cells 10 and rear surface protection member 40.

Note that solar cell module 1 in the present embodiment may be of the one-side light-reception type, and in the case where solar cell module 1 is of the one-side light-reception type, rear surface filling member 52 is not limited to the light-transmissive material and may be made from a colored material such as a black material or a white material.

[1-1-5. Frame]

Frame 60 is an outer frame covering the peripheral edge portion of solar cell module 1. Frame 60 is, for example, an aluminum frame (aluminum frame) made of aluminum. As illustrated in FIG. 1, four frames 60 are used which are fitted to the respective four sides of solar cell module 1. Frame 60 is bonded to each side of solar cell module 1 with, for example, an adhesive.

[1-2. Details of Solar Cell]

Next, the detailed configuration of solar cell 10 according to the present embodiment will be described with reference to FIG. 5A to FIG. 6B.

[1-2-1. Surface Structure of Silicon Substrate]

First, with reference to FIG. 5A and FIG. 5B, the surface structure of silicon substrate 10d according to the present embodiment will be described.

Figure 5A:
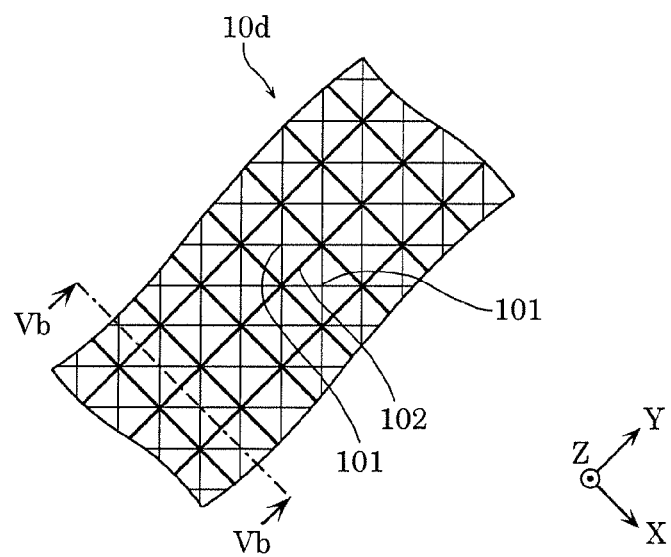
FIG. 5A is a schematic diagram illustrating an enlarged plane of a texture structure formed in a silicon substrate according to Embodiment 1.
Figure 5B:
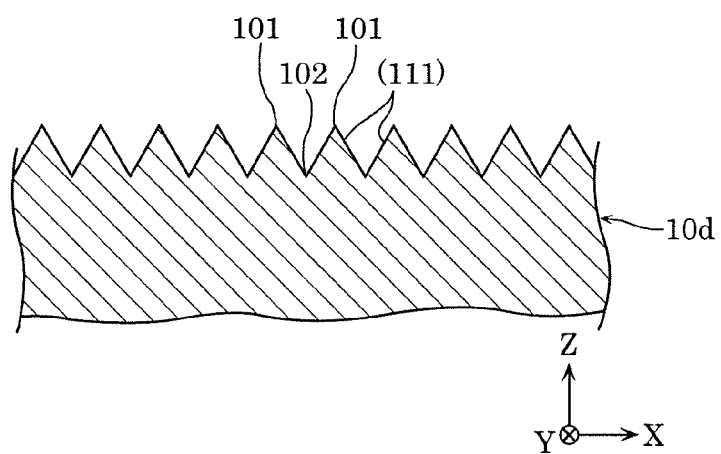
FIG. 5B is a cross-sectional view of a silicon substrate taken along line Vb-Vb of FIG. 5A.

FIG. 5A is a schematic diagram illustrating an enlarged plane of a texture structure formed in silicon substrate 10d according to the present embodiment. FIG. 5B is a cross-sectional view of silicon substrate 10d taken along line Vb-Vb of FIG. 5A. Note that FIG. 5A is a schematic diagram of the texture structure in the first principal surface.

As illustrated in FIG. 5A, the first principal surface of silicon substrate 10d includes a texture structure (recesses and protrusions) in which a plurality of pyramids are arranged in a matrix. As illustrated in FIG. 5B, the texture structure includes: substrate peak portion 101 of a quadrangular pyramid; and substrate valley portion 102 sandwiched between adjacent substrate peak portions 101. In the present embodiment, the pyramidal surface between substrate peak portion 101 and substrate valley portion 102 is a silicon crystal (111) surface. As with the first principal surface, the second principal surface may include a texture structure.

The height between substrate valley portion 102 and substrate peak portion 101 is, for example, between 1 μm and 10 μm, inclusive, and the distance between adjacent substrate peak portions 101 is, for example, between 1 μm and 10 μm, inclusive. Note that in the texture structure of silicon substrate 10d according to the present embodiment, the height and the pitch of substrate peak portions 101 and substrate valley portions 102 may be random or may be regular.

Furthermore, although an example of the texture structure of each of the first and second principal surfaces of silicon substrate 10d has been thus far described, the texture structure of the first principal surface and the texture structure of the second principal surface may have the same shape or may have different shapes. For example, since the angle of incidence of light is different between the first principal surface and the second principal surface, the shape of the texture structure of each of the principal surfaces may be determined according to the angle of incidence of light thereon.

[1-2-2. Structure of Non-Crystalline Silicon Layer]

Next, with reference to FIG. 6A and FIG. 6B, the non-crystalline silicon layer formed on the principal surface of silicon substrate 10d will be described. Note that the non-crystalline silicon layer on the first principal surface and the non-crystalline silicon layer on the second principal surface have substantially the same structure; the following will describe that on the first principal surface only.

Figure 6A:
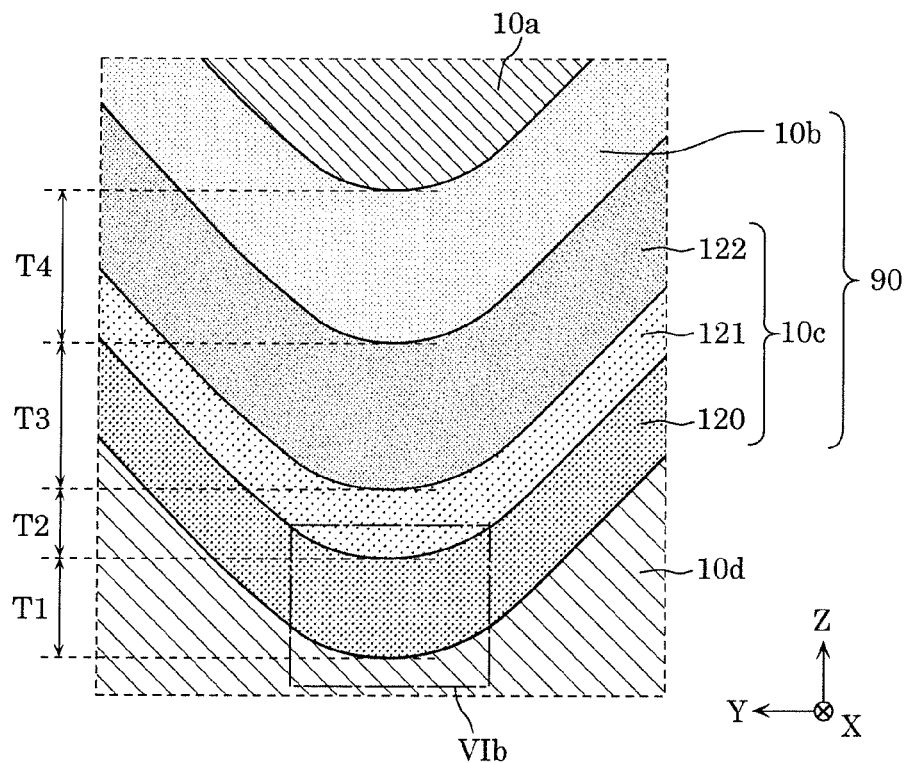
FIG. 6A is an enlarged cross-sectional view of a dashed area in FIG. 4.

FIG. 6A is an enlarged cross-sectional view of dashed area VIa in FIG. 4. Specifically, FIG. 6A is a cross-sectional view illustrating a magnified view of a stacked structure including silicon substrate 10d, first non-crystalline silicon layer 90, and n-side electrode 10a around a valley portion. The cross-sectional view of FIG. 6A illustrates: slant portion 104 connecting the peak portion (not illustrated in the drawings) of first non-crystalline silicon layer 90 and valley portion 103 (refer to FIG. 7); and valley portion 103 sandwiched between two adjacent slant portions 104. FIG. 6B is an enlarged cross-sectional view of dashed area VIb in FIG. 6A.

As illustrated in FIG. 6A, first non-crystalline silicon layer 90 includes i-type non-crystalline silicon layer 10c and n-type non-crystalline silicon layer 10b. In the present embodiment, i-type non-crystalline silicon layer 10c has a three-layered structure. In the present embodiment, first epitaxial layer 120, first intermediate layer 121, and first passivation layer 122 are formed in i-type non-crystalline silicon layer 10c. As illustrated in FIG. 6B, first epitaxial layer 120 includes epitaxially grown crystalline region 120a and non-crystalline region 120b. First intermediate layer 121 and first passivation layer 122 include only non-crystalline (amorphous) regions and are different in density (film density), etc. More specifically, the density of first intermediate layer 121 is less than the density of first passivation layer 122. Note that the density (film density) means mass per unit volume (for example, cubic centimeter) of each layer. In the present embodiment, n-type non-crystalline silicon layer 10b is a passivation layer including only a non-crystalline region. First intermediate layer 121 and n-type non-crystalline silicon layer 10b are different in density (film density), etc. More specifically, the density of first intermediate layer 121 is less than the density of n-type non-crystalline silicon layer 10b.

In first non-crystalline silicon layer 90, at valley portion 103, first epitaxial layer 120 including crystalline region 120a epitaxially grown on silicon substrate 10d, first intermediate layer 121 which is a non-crystalline silicon layer on first epitaxial layer 120, first passivation layer 122 which is a non-crystalline silicon layer on first intermediate layer 121, and n-type non-crystalline silicon layer 10b which is a non-crystalline silicon layer on first passivation layer 122 are stacked substantially perpendicularly to the first principal surface of silicon substrate 10d (in the positive direction of the Z-axis).

As illustrated in FIG. 6A, first non-crystalline silicon layer 90 includes recesses and protrusions reflecting the texture structure of the first principal surface of silicon substrate 10d. In addition, n-side electrode 10a also includes recesses and protrusions reflecting said texture structure.

Figure 6B:
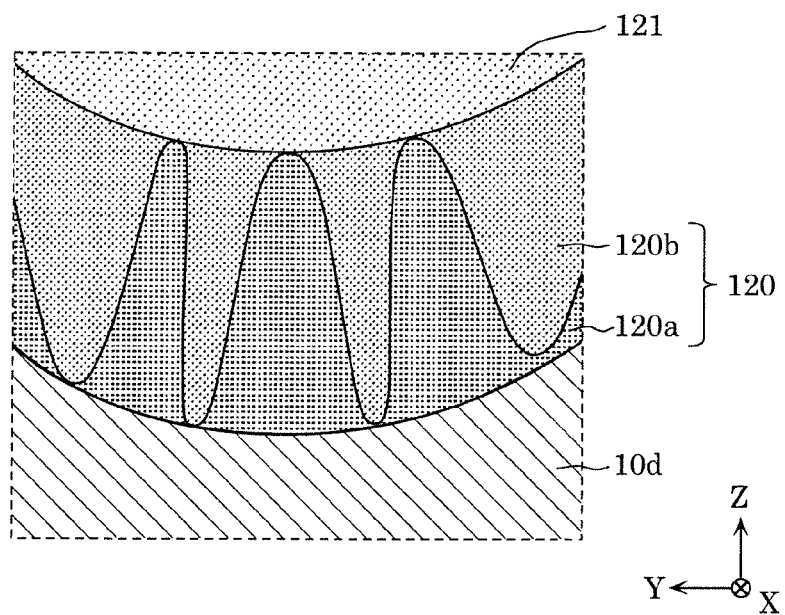
FIG. 6B is an enlarged cross-sectional view of a dashed area in FIG. 6A.

As illustrated in FIG. 6B, in the present embodiment, first epitaxial layer 120 in i-type non-crystalline silicon layer 10c includes crystalline region 120a and non-crystalline (amorphous) region 120b at valley portion 103. Crystalline region 120a may include, for example, a fine crystalline region or an epitaxial growth region reflecting the crystal orientation of silicon substrate 10d. Non-crystalline region 120b does not reflect the crystal orientation of silicon substrate 10d and is occupied by non-crystalline (amorphous) solids. Note that the electrical conductivity of first epitaxial layer 120 is between $1.0 \times 10^{-7}$ S/cm and $1.0 \times 10^{-5}$ S/cm, inclusive, as a dark conductivity, and is between $1.0 \times 10^{-4}$ S/cm and $1.0 \times 10^{-3}$ S/cm, inclusive, as a photoconductivity, for example.

As a result of including crystalline region 120a in first epitaxial layer 120, it is possible to suppress a decrease in the fill factor. Furthermore, the fill factor can be adjusted by adjusting the thickness of first epitaxial layer 120. The thickness of first epitaxial layer 120 can be adjusted by controlling time in which the layer is formed. Thus, even when the texture structure is miniaturized, it is possible to suppress a decrease in the fill factor by simple control such as adjustment of time in which first epitaxial layer 120 is formed. In other words, even when the texture structure is miniaturized, the fill factor can be maintained at a high level.

Note that the occupancy of each of crystalline region 120a and non-crystalline region 120b in first epitaxial layer 120 is not particularly limited. For example, first epitaxial layer 120 may include only crystalline region 120a. For example, at least in valley portion 103, first epitaxial layer 120 may include only crystalline region 120a. Crystalline region 120a exhibits better electrical conductivity than non-crystalline region 120b which is a main structural element of first epitaxial layer 120. Therefore, as the occupancy of crystalline region 120a in first epitaxial layer 120 increases, the resistance loss is reduced and thus, the fill factor increases. The occupancy is the ratio of the area of crystalline region 120a or non-crystalline region 120b to the area of valley portion 103 in first epitaxial layer 120 in a cross-sectional view of solar cell 10 (when viewed in the Y-axis).

Although FIG. 6B illustrates an example in which crystalline region 120a extends to first intermediate layer 121 formed on first epitaxial layer 120, this is not limiting. Crystalline region 120a is not required to extend to first intermediate layer 121.

Next, first intermediate layer 121 which is stacked on first epitaxial layer 120 will be described. First epitaxial layer 120 includes crystalline region 120a. At the time of layer formation, first intermediate layer 121 is formed in such a manner as to avoid the impact of crystalline region 120a of first epitaxial layer 120. Specifically, the layer formation speed (layer formation rate) at which first intermediate layer 121 is formed is set greater than the layer formation speed at which first epitaxial layer 120 is formed. For example, the layer formation speed at which first intermediate layer 121 is formed is three times the layer formation speed at which first epitaxial layer 120 is formed. With this, first intermediate layer 121 is formed without being affected by crystalline region 120a of first epitaxial layer 120. In other words, first intermediate layer 121 is formed to include only a non-crystalline region in which no epitaxial growth region is included. Furthermore, since the layer formation speed at which first intermediate layer 121 is formed is high, the density of first intermediate layer 121 is less than the density of first epitaxial layer 120. Note that first intermediate layer 121 is one example of the first amorphous layer.

Next, first passivation layer 122 which is formed on first intermediate layer 121 will be described. First intermediate layer 121 is formed to include only the non-crystalline region. Therefore, at the time of formation of first passivation layer 122, first passivation layer 122 is formed without being affected by crystalline region 120a of first epitaxial layer 120. Thus, first passivation layer 122 is formed to include only a non-crystalline region.

Generally, as the layer formation speed is reduced, a higher quality layer is formed. This means that when the layer formation speed is reduced, a layer having a high passivation effect is formed. Thus, first passivation layer 122 may be formed at a reduced layer formation speed. For example, the layer formation speed at which first passivation layer 122 is formed is less than the layer formation speed at which first epitaxial layer 120 is formed. As a result, the density of first passivation layer 122 is greater than the density of first epitaxial layer 120.

Furthermore, when the layer formation speed at which first passivation layer 122 is formed is reduced, the electrical conductivity of first passivation layer 122 increases. For example, when the layer formation speed at which first passivation layer 122 is formed is set less than the layer formation speed at which first intermediate layer 121 is formed, the electrical conductivity of first passivation layer 122 is higher than the electrical conductivity of first intermediate layer 121. The electrical conductivity of first intermediate layer 121 is between $1.0 \times 10^{-14}$ S/cm and $1.0 \times 10^{-10}$ S/cm, inclusive, as a dark conductivity, and is between $1.0 \times 10^{-7}$ S/cm and $1.0 \times 10^{-4}$ S/cm, inclusive, as a photoconductivity, for example. The electrical conductivity of first passivation layer 122 is between $1.0 \times 10^{-9}$ S/cm and $1.0 \times 10^{-7}$ S/cm, inclusive, as a dark conductivity and is between $1.0 \times 10^{-7}$ S/cm and $1.0 \times 10^{-4}$ S/cm, inclusive, as a photoconductivity, for example. This means that as a result of forming first passivation layer 122, it is possible to maintain a high passivation effect and suppress a decrease in the fill factor. Thus, even when the texture structure is miniaturized, it is possible to suppress a decrease in the fill factor and maintain the open circuit voltage at a high level.

Note that first intermediate layer 121 has a lower electrical conductivity than, for example, first epitaxial layer 120 and first passivation layer 122. In other words, the resistance loss at first intermediate layer 121 is significant. Therefore, since the fill factor of solar cell 10 decreases with the increase in the thickness of first intermediate layer 121, first intermediate layer 121 may be formed to be thin. First intermediate layer 121 may be formed to be as thin as possible within the range where first passivation layer 122 can be formed without being affected by first epitaxial layer 120. For example, the thickness of first intermediate layer 121 is less than the thickness of first passivation layer 122. For example, the thickness of first intermediate layer 121 is between 1 nm and 3 nm, inclusive. As with first epitaxial layer 120, the thickness can be adjusted by controlling time in which the layer is formed.

Next, n-type non-crystalline silicon layer 10b which is formed on first passivation layer 122 will be described. First passivation layer 122 is formed to include only the non-crystalline region. Therefore, at the time of formation of n-type non-crystalline silicon layer 10b, n-type non-crystalline silicon layer 10b is formed without being affected by crystalline region 120a of first epitaxial layer 120. Thus, n-type non-crystalline silicon layer 10b is formed to include only a non-crystalline region. Furthermore, as with first passivation layer 122, n-type non-crystalline silicon layer 10b may be formed at a reduced layer formation speed.

Note that each of first passivation layer 122 and n-type non-crystalline silicon layer 10b is one example of the second amorphous layer. The second amorphous layer is a non-crystalline silicon layer on the first intermediate layer. Note that n-type non-crystalline silicon layer 10b does not need to be included in the second amorphous layer.

First non-crystalline silicon layer 90 is substantially in an amorphous state except valley portion 103. Specifically, n-type non-crystalline silicon layer 10b and i-type non-crystalline silicon layer 10c (first epitaxial layer 120, first intermediate layer 121, and first passivation layer 122) are substantially in an amorphous state except valley portion 103.

Next, the range of valley portion 103 in first non-crystalline silicon layer 90 will be described.

Figure 7:
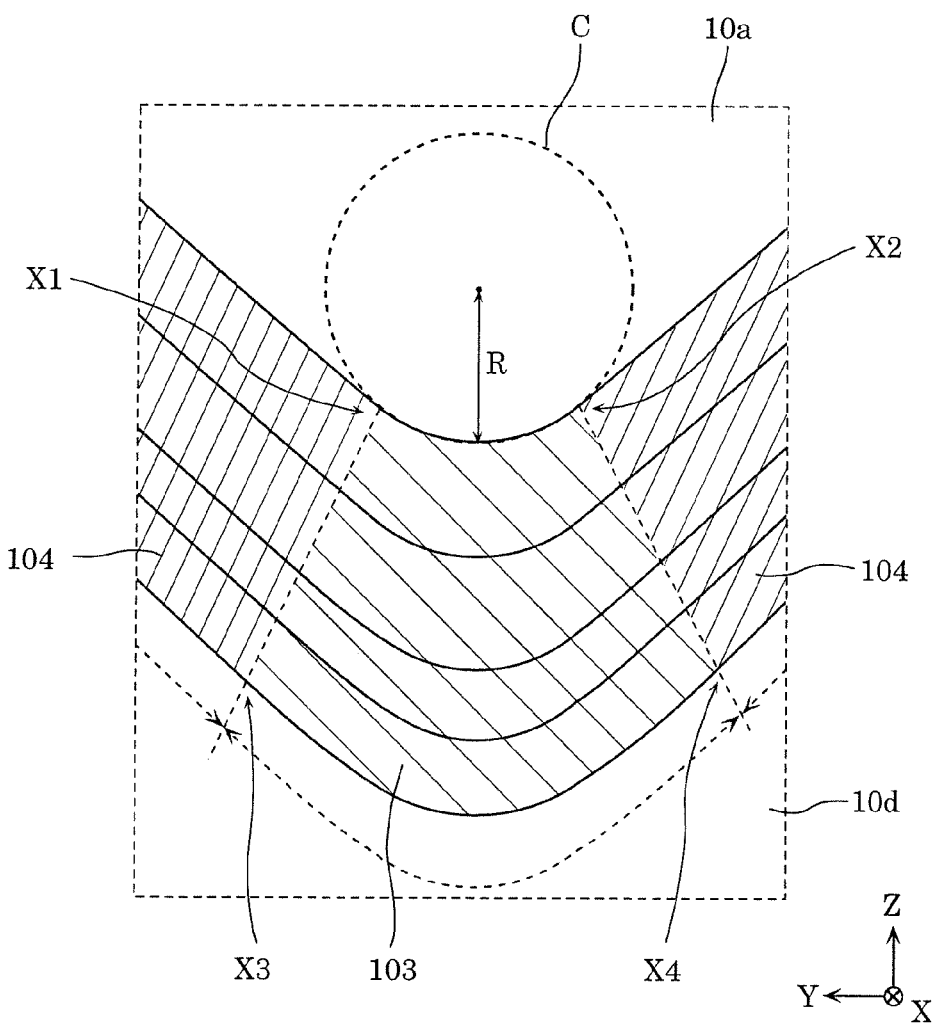
FIG. 7 is a diagram for describing a radius of curvature representing the round shape of a valley portion in a first non-crystalline silicon layer according to Embodiment 1.

FIG. 7 is a diagram for describing a radius of curvature representing the round shape of valley portion 103 in first non-crystalline silicon layer 90 according to the present embodiment. Valley portion 103 has a round shape reflecting the shape of substrate valley portion 102 of silicon substrate 10d in a cross-sectional view of solar cell 10. Valley portion 103 is a region sandwiched between slant portions 104 each extending substantially linearly. The range of valley portion 103 is defined as a region sandwiched between points X1, X2, X3, and X4 at each of which the slope of an inclined surface of slant portion 104 changes, as illustrated in FIG. 7. For example, valley portion 103 has radius of curvature R of between 1 nm and 300 nm, inclusive. Note that radius of curvature R of valley portion 103 is defined as the radius of circle C including a curved surface of valley portion 103 that is sandwiched between two points X1 and X2.

[1-3. Manufacturing Method]

Next, the method for manufacturing solar cell 10 according to the present embodiment will be described with reference to FIG. 8A to FIG. 9. Note that the following describes, as the manufacturing method, the case of forming non-crystalline silicon layer 90 and non-crystalline silicon layer 91 on the first principal surface and the second principal surface, respectively.

Figure 8A:
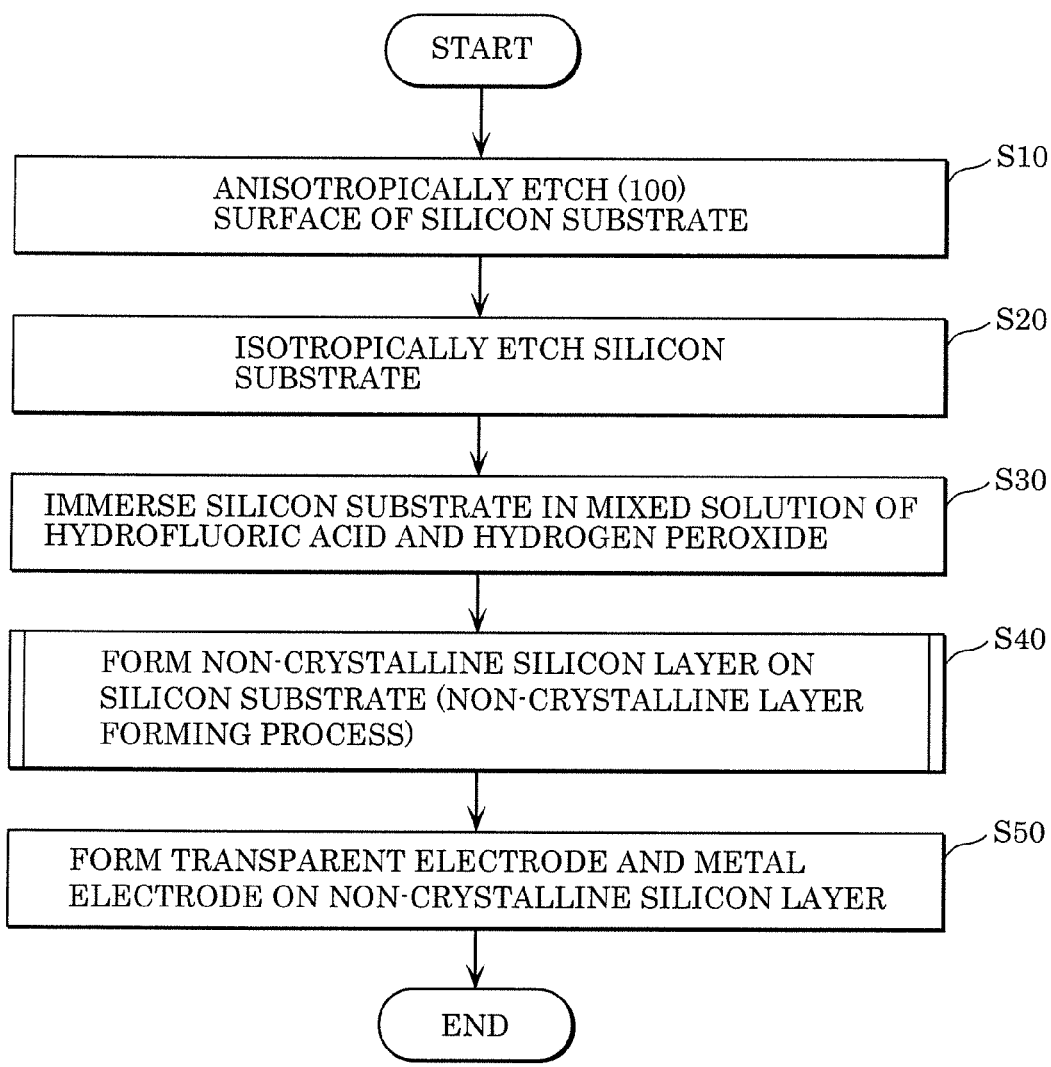
FIG. 8A is a flowchart illustrating a method for manufacturing a solar cell according to Embodiment 1.

FIG. 8A is a flowchart illustrating a method for manufacturing solar cell 10 according to the present embodiment.

First, the (100) surface of silicon substrate 10d is anisotropically etched (S10). By doing so, the texture structure in which the plurality of pyramids are arranged in a matrix is formed in each of the front and rear surfaces of silicon substrate 10d. In other words, the first principal surface and the second principal surface are formed.

Specifically, silicon substrate 10d having the (100) surface is immersed in etchant. The etchant contains an alkaline aqueous solution. The alkaline aqueous solution contains, for example, at least one of sodium hydroxide (NaOH), potassium hydroxide (KOH), and tetramethylammonium hydroxide (TMAH). By immersing the (100) surface of silicon substrate 10d in the aforementioned alkaline aqueous solution, the front and rear surfaces of silicon substrate 10d are anisotropically etched along the (111) surface. As a result, as illustrated in FIG. 5A and FIG. 5B, the texture structure in which the pyramids having substrate peak portions 101 and substrate valley portions 102 are arranged in a matrix is formed in each of the front and rear surfaces of silicon substrate 10d. The pyramidal surface of each of the pyramids is the (111) surface. Note that the concentration of the alkaline aqueous solution contained in the etchant is, for example, between 0.1% by weight and 10% by weight, inclusive. Note that among the recesses and protrusions of the texture structure, a recess portion depressed inward of silicon substrate 10d is defined as the valley portion.

Next, silicon substrate 10d having the aforementioned texture structure formed therein is isotropically etched (S20). By doing so, substrate valley portion 102 is machined into a round shape (refer to FIG. 6A and FIG. 6B). In the present process, specifically, wet etching using a mixed solution of hydrofluoric acid (HF) and nitric acid ($NHO_3$) or a mixed solution of hydrofluoric acid (HF), nitric acid ($HNO_3$), and acetic acid ($CH_3COOH$), or dry etching using a mixed gas of tetrafluoromethane ($CF_4$) and oxide ($O_2$) can be applied. The radius of curvature of substrate valley portion 102 can be adjusted by controlling the treatment time, the mixing ratio of the aforementioned materials, etc. Furthermore, substrate peak portion 101, a ridge portion of the texture structure, and the like may be rounded through the present process.

Next, silicon substrate 10d resulting from the above-described isotropic etching process is immersed in a mixed solution containing hydrofluoric acid (HF) and hydrogen peroxide ($H_2O_2$) (S30). In the present embodiment, as a result of using the mixed solution of hydrofluoric acid and hydrogen peroxide, the surface of substrate valley portion 102 formed into the round shape is selectively modified. Note that the concentration of the hydrofluoric acid contained in the aforementioned mixed solution may be between 0.1% by weight and 5% by weight, inclusive, and the concentration of the hydrogen peroxide may be between 0.1% by weight and 5% by weight, inclusive. More specifically, the concentration of the hydrofluoric acid contained in the aforementioned mixed solution may be between 0.5% by weight and 3% by weight, inclusive, and the concentration of the hydrogen peroxide may be between 2% by weight and 4% by weight, inclusive.

The modification of the surface of substrate valley portion 102 of silicon substrate 10d disturbs the crystalline nature of substrate valley portion 102 of silicon substrate 10d. Thus, the occurrence of only crystalline region 120a being formed in almost the entire region of valley portion 103 in silicon substrate 10d is reduced. As illustrated in FIG. 6B, crystalline region 120a grows on the first principal surface substantially perpendicularly, and becomes present in a discrete form in a plane substantially parallel to the first principal surface, at the upper end of valley portion 103 opposite to the lower end thereof contacting silicon substrate 10d. Thus, the entire region of valley portion 103 turns into crystalline region 120a, and it is possible to suppress a decrease in the open circuit voltage. Note that in the case where the entire region of first epitaxial layer 120 at valley portion 103 is formed into crystalline region 120a, Step S30 may be omitted.

Next, a non-crystalline layer forming process (S40) is performed in which first non-crystalline silicon layer 90 and second non-crystalline silicon layer 91 are formed on the first and second principal surfaces of surface-treated silicon substrate 10d. Note that in the case where the non-crystalline silicon layer having the layer structure at valley portion 103 described above is formed on non-crystalline silicon layer 90 only, the following process is performed on the first principal surface only. In this case, in the non-crystalline layer forming process, on the first principal surface of silicon substrate 10d including the texture structure in which the plurality of pyramids are arranged in a matrix, first non-crystalline silicon layer 90 including recesses and protrusions reflecting the texture structure is formed by chemical vapor deposition using a raw material gas containing silicon.

In the present process, i-type non-crystalline silicon layer 10c (first epitaxial layer 120, first intermediate layer 121, and first passivation layer 122), n-type non-crystalline silicon layer 10b, i-type non-crystalline silicon layer 10e, and p-type non-crystalline silicon layer 10f are formed in this order. Note that the order in which the layers are formed is not limited to this example. For example, i-type non-crystalline silicon layer 10c and i-type non-crystalline silicon layer 10e may be formed at the same time, and then n-type non-crystalline silicon layer 10b and p-type non-crystalline silicon layer 10f may be formed in this order.

Figure 8B:
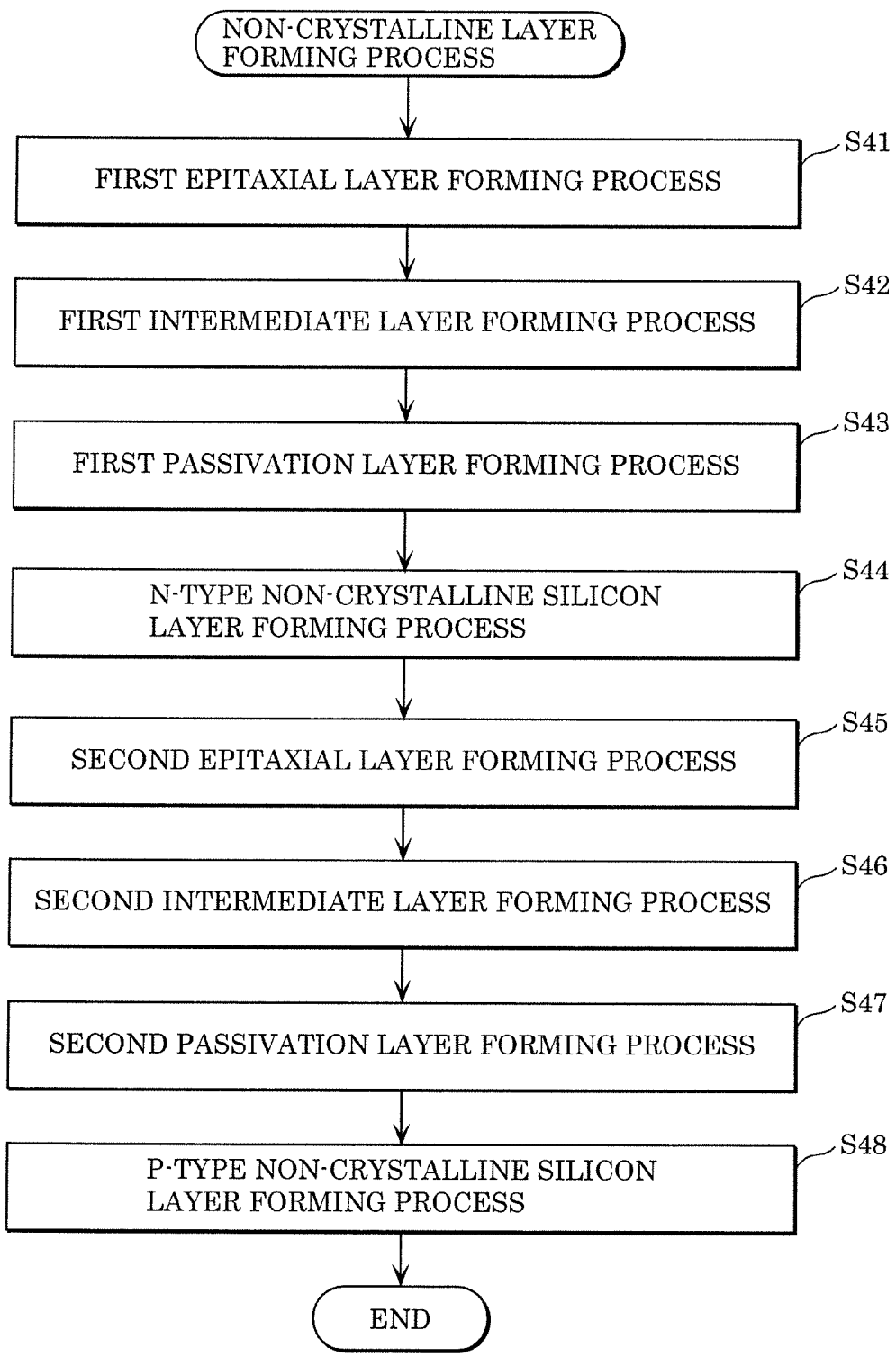
FIG. 8B is a flowchart illustrating a method for manufacturing a non-crystalline silicon layer according to Embodiment 1.

With reference to FIG. 8B, Step S40 will be described in more detail. FIG. 8B is a flowchart illustrating a method for manufacturing non-crystalline silicon layers 90 and 91 according to the present embodiment.

First, a first epitaxial layer forming process (S41) is performed in which first epitaxial layer 120 is formed on the first principal surface of silicon substrate 10d. For example, first epitaxial layer 120 is formed by plasma-enhanced chemical vapor deposition (PECVD), catalytic chemical vapor deposition (Cat-CVD), sputtering, or the like. Any of RF plasma CVD, VHF plasma CVD in which a high frequency is applied, microwave plasma CVD, and the like may be used as PECVD. In the present embodiment, first epitaxial layer 120 is formed by RF plasma CVD, for example. Specifically, a gas obtained by diluting a silicon-containing gas such as silane ($SiH_4$) with hydrogen is supplied to a layer forming chamber, and RF power is applied to a parallel plate electrode placed in the layer forming chamber, causing the gas to turn into plasma. This plasma gas is supplied to the first principal surface of silicon substrate 10d heated to a temperature of between 150° C. and 250° C., inclusive, and thus first epitaxial layer 120 is formed.

By controlling the layer formation speed at which first epitaxial layer 120 is formed, it is possible to control whether or not first epitaxial layer 120 includes crystalline region 120a including an epitaxial growth region. When the layer formation speed at which first epitaxial layer 120 is formed (the speed at which the gas is supplied) is set high, no epitaxial growth region is formed. When the layer formation speed is set low, the susceptibility to the crystal orientation of silicon substrate 10d is high, and thus only crystalline region 120a is formed and no non-crystalline region 120b is formed. Therefore, first epitaxial layer 120 is formed at a layer formation speed that allows both crystalline region 120a and non-crystalline region 120b to be formed. The layer formation speed at which first epitaxial layer 120 is formed is, for example, between 0.1 Å/seconds and 3 Å/seconds, inclusive. The density (film density) of first epitaxial layer 120 formed at the layer formation speed is, for example, between 2.2 $g/cm^3$ and 2.4 $g/cm^3$, inclusive. The hydrogen concentration is, for example, between $1\times10^{21}/cm^3$ and $5\times10^{22}/cm^3$, inclusive.

Note that the layer formation speed is adjusted by controlling, for example, the flow rate of the gas that is being supplied. For example, it is possible to increase the layer formation speed by increasing the flow rate. Note that the method for adjusting the layer formation speed is not limited to this example. For example, the temperature of silicon substrate 10d, the pressure in the layer forming chamber, the RF power, and the like can be used for the adjustment. For example, it is possible to increase the layer formation speed by increasing the temperature of silicon substrate 10d, the pressure in the layer forming chamber, and the RF power.

Furthermore, the thickness of first epitaxial layer 120 is controlled according to the layer formation time. It is possible to increase the thickness of first epitaxial layer 120 by increasing the layer formation time. The layer formation time for first epitaxial layer 120 is determined, as appropriate, according to the target thickness of first epitaxial layer 120 and the layer formation speed at which first epitaxial layer 120 is formed. Note that the target thickness is, for example, a target value of the thickness of first epitaxial layer 120 that is set to obtain a desired fill factor. The thickness of first epitaxial layer 120 is, for example, between 1 nm and 25 nm, inclusive. Note that the thickness of first epitaxial layer 120 is the thickness of first epitaxial layer 120 at valley portion 103 along the Z-axis, and corresponds to thickness T1 illustrated in FIG. 6A.

Next, a first intermediate layer forming process (S42) in which first intermediate layer 121 is formed on first epitaxial layer 120 is performed, and a first passivation layer forming process (S43) in which first passivation layer 122 is formed on first intermediate layer 121 is performed after Step S42. In the present embodiment, first epitaxial layer 120, first intermediate layer 121, and first passivation layer 122 are formed in i-type non-crystalline silicon layer 10c. Therefore, in the first intermediate layer forming process in which first intermediate layer 121 is formed and in the first passivation layer forming process in which first passivation layer 122 is formed, a layer formation method, a material, etc., that are the same as those used in the first epitaxial layer forming process are used. The difference from the first epitaxial layer forming process is the layer forming condition.

First, the first intermediate layer forming process (S42) in which first intermediate layer 121 is formed will be described. When the layer formation speed at which first intermediate layer 121 is formed is set high, only a non-crystalline region is formed in first intermediate layer 121. When the layer formation speed is reduced, a crystalline region including an epitaxial growth region is formed in first intermediate layer 121 under the impact of crystalline region 120a of first epitaxial layer 120. Thus, first intermediate layer 121 is formed at the layer formation speed that allows only the non-crystalline region to be formed. The layer formation speed at which first intermediate layer 121 is formed is, for example, between 3 Å/seconds and 5 Å/seconds, inclusive. The density (film density) of first intermediate layer 121 formed at the layer formation speed is, for example, between 2.0 g/cm$^3$ and 2.2 g/cm$^3$, inclusive. The hydrogen concentration is, for example, between $1\times10^{21}$/cm$^3$ and $5\times10^{22}$/cm$^3$, inclusive.

Furthermore, the thickness of first intermediate layer 121 is controlled according to the layer formation time. It is possible to increase the thickness of first intermediate layer 121 by increasing the layer formation time. Note that the thickness (target thickness) of first intermediate layer 121 may be set as small as possible within the range where first passivation layer 122 which is formed on first intermediate layer 121 is not affected by crystalline region 120a of first epitaxial layer 120. This is to reduce a decrease in the fill factor that is caused due to first intermediate layer 121. The time in which first intermediate layer 121 is formed is determined, as appropriate, according to the target thickness of first intermediate layer 121 and the layer formation speed at which first intermediate layer 121 is formed. The thickness of first intermediate layer 121 is, for example, between 1 nm and 3 nm, inclusive. Note that the thickness of first intermediate layer 121 is the thickness of first intermediate layer 121 at valley portion 103 along the Z-axis, and corresponds to thickness T2 illustrated in FIG. 6A.

In the present embodiment, the first intermediate layer forming process is one example of the first amorphous layer forming process.

Note that the adjustment of the layer formation speed is substantially the same as that in Step S41 and thus description thereof will be omitted.

Next, the first passivation layer forming process (S43) in which first passivation layer 122 is formed will be described. As first passivation layer 122, only a non-crystalline region is formed regardless of the layer formation speed. This is because first passivation layer 122 is formed on first intermediate layer 121 formed to include only the non-crystalline region. This means that due to first intermediate layer 121 having been formed, first passivation layer 122 is formed without being affected by crystalline region 120a of first epitaxial layer 120. Note that since a layer having higher quality is formed at a lower layer formation speed, the layer formation speed at which first passivation layer 122 is formed may be set low. With this, first passivation layer 122 having a high passivation effect is formed. The layer formation speed at which first passivation layer 122 is formed is, for example, between 0.1 Å/seconds and 5 Å/seconds, inclusive. The density (film density) of first passivation layer 122 formed at the layer formation speed is, for example, between 2.2 g/cm$^3$ and 2.4 g/cm$^3$, inclusive. The hydrogen concentration is, for example, between $1\times10^{21}$/cm$^3$ and $5\times10^{22}$/cm$^3$, inclusive.

Furthermore, the thickness of first passivation layer 122 is controlled according to the layer formation time. It is possible to increase the thickness of first passivation layer 122 by increasing the layer formation time. Note that the thickness of first passivation layer 122 is not particularly limited. For example, first passivation layer 122 is formed to have a greater thickness than first intermediate layer 121. For example, the layer formation time in which first passivation layer 122 is formed is determined, as appropriate, according to the target thickness of first passivation layer 122 and the layer formation speed at which first passivation layer 122 is formed. Note that the target thickness is, for example, a target value of the thickness of first passivation layer 122 that is set to obtain a desired open circuit voltage. The thickness of first passivation layer 122 is, for example, between 1 nm and 25 nm, inclusive. Note that the thickness of first passivation layer 122 is the thickness of first passivation layer 122 at valley portion 103 along the Z-axis, and corresponds to thickness T3 illustrated in FIG. 6A.

Furthermore, although the foregoing has described an example in which the thickness of first intermediate layer 121 is less than the thickness of first passivation layer 122, this is not limiting. For example, the thickness of first passivation layer 122 may be the same as or less than the thickness of first intermediate layer 121 as long as a desired open circuit voltage can be obtained. In other words, the thickness of first intermediate layer 121 may be greater than the thickness of first passivation layer 122.

Next, an n-type non-crystalline silicon layer forming process (S44) is performed in which n-type non-crystalline silicon layer 10b is formed on first passivation layer 122. For example, n-type non-crystalline silicon layer 10b is formed by PECVD, Cat-CVD, sputtering, and the like. As the PECVD, RF plasma CVD is applied. Specifically, a mixed gas obtained by diluting, with hydrogen, a silicon-containing gas such as silane (SiH$_4$) and an n-type dopant-containing gas such as phosphine (PH$_3$) is supplied to a layer forming chamber, and RF power is applied to a parallel plate electrode placed in the layer forming chamber, causing the mixed gas to turn into plasma. Note that the plasma gas is supplied to the first principal surface of silicon substrate 10d heated to a temperature of between 150° C. and 250° C., inclusive, and thus n-type non-crystalline silicon layer 10b is formed on first passivation layer 122.

As n-type non-crystalline silicon layer 10b, only a non-crystalline region is formed regardless of the layer formation speed. This is because n-type non-crystalline silicon layer 10b is formed on first passivation layer 122 formed to include only the non-crystalline region. Note that since a layer having higher quality is formed at a lower layer formation speed, the layer formation speed at which n-type non-crystalline silicon layer 10b is formed may be set low. With this, non-crystalline silicon layer 10b having a high passivation effect is formed. The layer formation speed at which n-type non-crystalline silicon layer 10b is formed is, for example, between 0.1 Å/seconds and 5 Å/seconds, inclusive. The density (film density) of n-type non-crystalline silicon layer 10b formed at the layer formation speed is, for example, between 2.2 g/cm$^3$ and 2.4 g/cm$^3$, inclusive. The hydrogen concentration is, for example, between $1\times10^{21}$/cm$^3$ and $5\times10^{22}$/cm$^3$, inclusive.

Furthermore, the thickness of n-type non-crystalline silicon layer 10b is controlled according to the layer formation time. It is possible to increase the thickness of n-type non-crystalline silicon layer 10b by increasing the layer formation time. Note that the thickness of n-type non-crystalline silicon layer 10b is not particularly limited. For example, n-type non-crystalline silicon layer 10b is formed to have a thickness comparable to the thickness of first passivation layer 122. For example, the layer formation time in which n-type non-crystalline silicon layer 10b is formed is determined, as appropriate, according to the target thickness of n-type non-crystalline silicon layer 10b and the layer formation speed at which n-type non-crystalline silicon layer 10b is formed. Note that the target thickness is, for example, a target value of the thickness of n-type non-crystalline silicon layer 10b that is set to obtain a desired open circuit voltage. The thickness of n-type non-crystalline silicon layer 10b is, for example, between 1 nm and 25 nm, inclusive. Note that the thickness of n-type non-crystalline silicon layer 10b is the thickness of n-type non-crystalline silicon layer 10b at valley portion 103 along the Z-axis, and corresponds to thickness T4 illustrated in FIG. 6A.

In the present embodiment, each of the first passivation layer forming process and the n-type non-crystalline silicon layer forming process is one example of the second amorphous layer forming process. Note that the n-type non-crystalline silicon layer forming process does not need to be included in the second amorphous layer forming process.

Next, with reference to FIG. 9, the layer formation speed and the layer formation time in the non-crystalline layer forming process will be described.

FIG. 9 is a diagram illustrating layer forming conditions for forming non-crystalline silicon layer 90 according to the present embodiment. Specifically, FIG. 9 is a diagram illustrating one example of relative comparison between the layer forming conditions in the respective processes and relative comparison in performance between the resultant layers. Note that the performance of a layer is indicated in parentheses.

As illustrated in FIG. 9, the layer formation speed in the first intermediate layer forming process is greater than the layer formation speed in the first epitaxial layer forming process. For example, the layer formation speed in the first intermediate layer forming process is three times the layer formation speed in the first epitaxial layer forming process. With this, first intermediate layer 121 is formed without being affected by first epitaxial layer 120 to include only the non-crystalline region.

The layer formation speed in each of the first passivation layer forming process and the n-type non-crystalline silicon layer forming process is less than the layer formation speed in the first intermediate layer forming process. As a result, each of first passivation layer 122 and n-type non-crystalline silicon layer 10b is formed to have a greater density and higher quality than first intermediate layer 121. In other words, each of first passivation layer 122 and n-type non-crystalline silicon layer 10b has a high passivation effect and high electrical conductivity. Thus, with first passivation layer 122 and n-type non-crystalline silicon layer 10b, it is possible to suppress a decrease in the fill factor and maintain a high open circuit voltage in first non-crystalline silicon layer 90.

As noted above, the layer formation speed in the first epitaxial layer forming process is greater than the layer formation speed in the first passivation layer forming process and is less than the layer formation speed in the first intermediate layer forming process, for example. This means that the density of first epitaxial layer 120 is greater than the density of first intermediate layer 121 and is less than the density of first passivation layer 122. Therefore, in first epitaxial layer 120, both crystalline region 120a including the epitaxial growth region and non-crystalline region 120b are formed. This means that with non-crystalline region 120b, it is possible to suppress a decrease in the open circuit voltage that is caused due to crystalline region 120a.

Although FIG. 9 shows an example in which the density of first epitaxial layer 120 is greater than the density of first intermediate layer 121 and is less than the density of first passivation layer 122 and the density of n-type non-crystalline silicon layer 10b, this is not limiting. The density of first epitaxial layer 120 is not particularly limited as long as it is greater than the density of first intermediate layer 121. For example, the density of first epitaxial layer 120 may be greater than the density of at least one of first passivation layer 122 and n-type non-crystalline silicon layer 10b. When the density of first epitaxial layer 120 is greater than the density of first intermediate layer 121, in other words, when the layer formation speed in the first epitaxial layer forming process is less than the layer formation speed in the first intermediate layer forming process, it is more likely that crystalline region 120a is formed in first epitaxial layer 120. Thus, with crystalline region 120a formed in first epitaxial layer 120, the fill factor of first non-crystalline silicon layer 90 can be maintained at a high level. Note that the layer formation speed in the first epitaxial layer forming process may be less than the layer formation speed in the first passivation layer forming process. Furthermore, the layer formation speed in the first epitaxial layer forming process may be less than the layer formation speed in the n-type non-crystalline silicon layer forming process.

Furthermore, the layer formation time in the first intermediate layer forming process is shorter than the layer formation time in the first passivation layer forming process. With this, first intermediate layer 121 is formed to have a thickness less than the thickness of first passivation layer 122. Since the resistance loss is significant in first intermediate layer 121, a decrease in the fill factor that is caused due to formation of first intermediate layer 121 can be suppressed as a result of first intermediate layer 121 being formed to have a small thickness.

Although FIG. 9 shows an example in which the layer formation time in the first epitaxial layer forming process is longer than the layer formation time in the first intermediate layer forming process and is shorter than the layer forming time in each of the first passivation layer forming process and the n-type non-crystalline silicon layer forming process, this is not limiting. The layer formation time in the first epitaxial layer forming process may be shorter than the layer formation time in the first intermediate layer forming process, and may be longer than the layer formation time in each of the first passivation layer forming process and the n-type non-crystalline silicon layer forming process. The layer formation time in the first epitaxial layer forming process is determined, as appropriate, according to the layer formation speed in the first epitaxial layer forming process and the target thickness of first epitaxial layer 120.

Next, a process in which second non-crystalline silicon layer 91 is formed on the second principal surface of silicon substrate 10d will be described. Note that a texture structure in which a plurality of pyramids are arranged in a matrix is formed in the second principal surface in Step S10. Illustrations of a second epitaxial layer, a second intermediate layer, and a second passivation layer on the second principal surface are omitted. In the present embodiment, the second epitaxial layer, the second intermediate layer, and the second passivation layer are formed in i-type non-crystalline silicon layer 10e.

Second non-crystalline silicon layer 91 which is on the second principal surface of silicon substrate 10d is stacked on the p-side electrode 10g-side (in the negative direction of the Z-axis) with respect to the second principal surface of silicon substrate 10d; in Steps S45 to S48, stacking layers in the negative direction of the Z-axis is expressed as forming a layer on a layer. For example, forming the second intermediate layer on the second epitaxial layer means forming (stacking) the second intermediate layer in the negative direction of the Z-axis with respect to the second epitaxial layer.

First, a second epitaxial layer forming process (S45) is performed in which a second epitaxial layer including an epitaxial growth region is formed on the second principal surface of silicon substrate 10d.

The method for forming the second epitaxial layer is substantially the same as the method for forming first epitaxial layer 120 (Step S41), and thus description thereof will be omitted. Note that, for example, the density and the thickness of the second epitaxial layer may be different from the density and the thickness of first epitaxial layer 120. When different density and thickness are applied, the layer formation speed and the layer formation time are used for adjustment. The second epitaxial layer is formed, for example, from the same material as that of first epitaxial layer 120.

Next, a second intermediate layer forming process (S46) in which a second intermediate layer is formed on the second epitaxial layer is performed, and a second passivation layer forming process (S47) in which a second passivation layer is formed on the second intermediate layer is performed after Step S46. In the present embodiment, the second epitaxial layer, the second intermediate layer, and the second passivation layer are formed in i-type non-crystalline silicon layer 10e. Therefore, in the second intermediate layer forming process in which the second intermediate layer is formed and in the second passivation layer forming process in which the second passivation layer is formed, a layer formation method, a material, etc., that are the same as those used in the second epitaxial layer forming process are used.

The method for forming the second intermediate layer is substantially the same as the method for forming first intermediate layer 121 (Step S42), and thus description thereof will be omitted. The second intermediate layer is formed to include only a non-crystalline region. Note that, for example, the density and the thickness of the second intermediate layer may be different from the density and the thickness of first intermediate layer 121. When different density and thickness are applied, the layer formation speed and the layer formation time are used for adjustment. The second intermediate layer is formed, for example, from the same material as that of first intermediate layer 121. Note that the second intermediate layer is one example of the third amorphous layer.

The method for forming the second passivation layer is substantially the same as the method for forming first passivation layer 122 (Step S43), and thus description thereof will be omitted. The second passivation layer is formed to include only a non-crystalline region. Note that, for example, the density and the thickness of the second passivation layer may be different from the density and the thickness of first passivation layer 122. When different density and thickness are applied, the layer formation speed and the layer formation time are used for adjustment. The second passivation layer is formed, for example, from the same material as that of first passivation layer 122.

Next, a p-type non-crystalline silicon layer forming process (S48) is performed in which p-type non-crystalline silicon layer 10f is formed on the second passivation layer. P-type non-crystalline silicon layer 10f is formed by PECVD, Cat-CVD, sputtering, and the like. As the PECVD, RF plasma CVD is applied. Specifically, a mixed gas obtained by diluting, with hydrogen, a silicon-containing gas such as silane ($SiH_4$) and a p-type dopant-containing gas such as diborane ($B_2H_6$) is supplied to a layer forming chamber, and RF power is applied to a parallel plate electrode placed in the layer forming chamber, causing the mixed gas to turn into plasma. Note that the concentration of diborane ($B_2H_6$) in the mixed gas is, for example, 1%. This plasma gas is supplied to the second principal surface of silicon substrate 10d heated to a temperature of between 150° C. and 250° C., inclusive, and thus p-type non-crystalline silicon layer 10f is formed on the second passivation layer.

As p-type non-crystalline silicon layer 10f, only a non-crystalline region is formed regardless of the layer formation speed. This is because p-type non-crystalline silicon layer 10f is formed on the second passivation layer formed to include only the non-crystalline region. Note that since a layer having higher quality is formed at a lower layer formation speed, the layer formation speed at which p-type non-crystalline silicon layer 10f is formed may be set low. With this, p-type non-crystalline silicon layer 10f having a high passivation effect is formed.

Note that each of the second passivation layer and p-type non-crystalline silicon layer 10f is one example of the fourth amorphous layer.

In second non-crystalline silicon layer 91, at a valley portion in the recesses and protrusions, a second epitaxial layer including a crystalline region epitaxially grown on silicon substrate 10d; a second intermediate layer which is a non-crystalline silicon layer on the second epitaxial layer; a second passivation layer which is a non-crystalline silicon layer on the second intermediate layer; and a p-type non-crystalline silicon layer 10f which is a non-crystalline silicon layer on the second passivation layer are stacked substantially perpendicularly to the second principal surface of silicon substrate 10d (in the negative direction of the Z-axis). The density of the second intermediate layer is less than the density of each of the second passivation layer and p-type non-crystalline silicon layer 10f.

Through the above processes (S41 to S48), non-crystalline silicon layers 90 and 91 are formed on the first principal surface and the second principal surface of silicon substrate 10d.

With reference back to FIG. 8A, n-side electrode 10a and p-side electrode 10g which are transparent electrodes, and front surface collector 11 and rear surface collector 12 which are metal electrodes, are formed lastly on non-crystalline silicon layers 90 and 91 (S50). First, n-side electrode 10a is formed on n-type non-crystalline silicon layer 10b, and p-side electrode 10g is formed on p-type non-crystalline silicon layer 10f. Specifically, a transparent conducting oxide such as indium tin oxide (ITO) is formed on each of n-type non-crystalline silicon layer 10b and p-type non-crystalline silicon layer 10f by vapor deposition, sputtering, and the like. Subsequently, front surface collector 11 (metal electrode) including finger electrode 70 is formed on n-type electrode 10a, and rear surface collector 12 (metal electrode) including finger electrode 70 is formed on p-side electrode 10g. Each of front surface collector 11 and rear surface collector 12 can be formed by a printing technique such as screen printing, for example, using thermosetting resin-type conductive paste containing a resin material as binder and conducting particles such as silver particles as filler.

Through the above processes (S10 to S50), solar cell 10 according to the present embodiment is formed.

Although the foregoing has described an example in which first epitaxial layer 120, first intermediate layer 121, and first passivation layer 122 are formed in i-type non-crystalline silicon layer 10c and the passivation layer is formed in n-type non-crystalline silicon layer 10b, this is not limiting. For example, first epitaxial layer 120 and first intermediate layer 121 may be formed in i-type non-crystalline silicon layer 10c, and the passivation layer may be formed in n-type non-crystalline silicon layer 10b. Alternatively, first epitaxial layer 120 may be formed in i-type non-crystalline silicon layer 10c, and first intermediate layer 121 and the passivation layer may be formed in n-type non-crystalline silicon layer 10b. It is sufficient that in consideration of the fill factor (FF) and the open circuit voltage (Voc), layers (i-type non-crystalline silicon layer 10c and n-type non-crystalline silicon layer 10b) in which first epitaxial layer 120, first intermediate layer 121, and first passivation layer 122 (the passivation layer) are formed be determined as appropriate. Note that in the above-described case, the passivation layer formed on n-type non-crystalline silicon layer 10b is one example of the second amorphous layer.

In the case of solar cell 10 according to the present embodiment, the second amorphous layer is formed in first passivation layer 122 and n-type non-crystalline silicon layer 10b. With this, a part of the second amorphous layer is of the same conductivity type as the conductivity type of silicon substrate 10d (n-type monocrystalline silicon substrate). Alternatively, in the case where the passivation layer is formed in n-type non-crystalline silicon layer 10b only, the second amorphous layer is of the same conductivity type as the conductivity type of silicon substrate 10d. This means that a layer of the same conductivity type as the conductivity type of silicon substrate 10d depends on which of first epitaxial layer 120, first intermediate layer 121, and the passivation layer (second amorphous layer) is formed on n-type non-crystalline silicon layer 10b. In other words, a part of at least one of first epitaxial layer 120, first intermediate layer 121 (first amorphous layer), and the passivation layer (second amorphous layer) is of the same conductivity type as the conductivity type of silicon substrate 10d.

In contrast, in the case of second non-crystalline silicon layer 91 of a conductivity type different from the conductivity type of silicon substrate 10d, carriers are effectively separated at a p-n junction which is an interface. Therefore, the significance of considering the resistance loss at the p-n junction is low. Thus, in second non-crystalline silicon layer 91 which is of a conductivity type different from the conductivity type of silicon substrate 10d, the second epitaxial layer may be formed to have a thickness less than the thickness of first epitaxial layer 120. Furthermore, second non-crystalline silicon layer 91 does not need to include the second epitaxial layer. In other words, i-type non-crystalline silicon layer 10e may be formed to include only the non-crystalline region.

Thus, with first non-crystalline silicon layer 90 which is of the same conductivity type as the conductivity type of silicon substrate 10d, the resistance loss is reduced, which causes an increase in the fill factor, and the open circuit voltage increases. In addition, with second non-crystalline silicon layer 91 which is of a conductivity type different from the conductivity type of silicon substrate 10d, it is possible to effectively increase the open circuit voltage.

Note that even when the conductivity type of second non-crystalline silicon layer 91 is different from the conductivity type of silicon substrate 10d, second non-crystalline silicon layer 91 may include the second epitaxial layer, the second intermediate layer, and the passivation layer (the second passivation layer and p-type non-crystalline silicon layer 100 as described above.

[1-4. Advantageous Effects]

Solar cell 10 according to the present embodiment includes: silicon substrate 10d including, in a first principal surface, a texture structure in which a plurality of pyramids are arranged in a matrix; and first non-crystalline silicon layer 90 formed on the first principal surface of silicon substrate 10d and including recesses and protrusions reflecting the texture structure. At valley portion 103 in the recesses and protrusions, first non-crystalline silicon layer 90 includes, in the stated order: first epitaxial layer 120 including crystalline region 120a epitaxially grown on silicon substrate 10d; a first amorphous layer (first intermediate layer 121) which is a non-crystalline silicon layer on first epitaxial layer 120; and a second amorphous layer (first passivation layer 122 and n-type non-crystalline silicon layer 10b) which is a non-crystalline silicon layer on the first amorphous layer. The first amorphous layer has a density less than the density of the second amorphous layer.

In solar cell 10 according to the present disclosure, at valley portion 103 in the recesses and protrusions of the first principal surface, first epitaxial layer 120 including epitaxially grown crystalline region 120a, the first amorphous layer (first intermediate layer 121) which is a non-crystalline silicon layer, and the second amorphous layer (first passivation layer 122 and n-type non-crystalline silicon layer 10b) which is a non-crystalline silicon layer are formed in this order.

Since first epitaxial layer 120 is formed, the resistance loss in first non-crystalline silicon layer 90 is reduced, and thus the fill factor (FF) of solar cell 10 increases.

First intermediate layer 121 is formed to have a density less than the density of each of first passivation layer 122 and n-type non-crystalline silicon layer 10b; thus, first intermediate layer 121 is formed without being affected by crystalline region 120a of first epitaxial layer 120. This means that first intermediate layer 121 includes only a non-crystalline region.

First passivation layer 122 and n-type non-crystalline silicon layer 10b are formed on first intermediate layer 121 including only the non-crystalline region; thus, passivation layer 122 and n-type non-crystalline silicon layer 10b are formed without being affected by crystalline region 120a of first epitaxial layer 120. This means that each of first passivation layer 122 and n-type non-crystalline silicon layer 10b includes only a non-crystalline region. With this, it is possible to increase the open circuit voltage (Voc) in first non-crystalline silicon layer 90. Furthermore, the density of first intermediate layer 121 is less than the density of each of first passivation layer 122 and n-type non-crystalline silicon layer 10b. In other words, the density of each of first passivation layer 122 and n-type non-crystalline silicon layer 10b is high, and thus each of first passivation layer 122 and n-type non-crystalline silicon layer 10b has a high passivation effect and high electrical conductivity. With this, it is possible to suppress a decrease in the fill factor that is caused due to first passivation layer 122 and n-type non-crystalline silicon layer 10b, and it is further possible to increase the open circuit voltage in first non-crystalline silicon layer 90.

Thus, with solar cell 10 according to the present embodiment, it is possible to maintain a high fill factor and a high open circuit voltage even when the solar cell has a miniaturized texture structure.

Furthermore, first intermediate layer 121 has a thickness less than the thickness of first passivation layer 122 and n-type non-crystalline silicon layer 10b.

First intermediate layer 121 has lower electrical conductivity and greater resistance low than first passivation layer 122 and n-type non-crystalline silicon layer 10b. By forming first intermediate layer 121 to have a thickness less than the thickness of each of first passivation layer 122 and n-type non-crystalline silicon layer 10b, it is possible to reduce a resistance loss that is caused due to first intermediate layer 121. This means that it is possible to suppress a decrease in the fill factor that is caused due to first intermediate layer 121.

Furthermore, first intermediate layer 121 has a thickness of between 1 nm and 3 nm, inclusive.

When the thickness of first intermediate layer 121 is greater than or equal to 1 nm, first passivation layer 122 to be formed on first intermediate layer 121 is formed without being affected by crystalline region 120a of first epitaxial layer 120. Furthermore, as a result of setting the thickness of first intermediate layer 121 to be less than or equal to 3 nm, it is possible to reduce a resistance loss that is caused due to first intermediate layer 121. Thus, when first intermediate layer 121 has a thickness of between 1 nm and 3 nm, inclusive, a decrease in the fill factor that is caused due to first intermediate layer 121 is suppressed, and it is possible to form first passivation layer 122 including only a non-crystalline region.

Furthermore, first epitaxial layer 120 further includes non-crystalline region 120b.

Since first epitaxial layer 120 includes non-crystalline region 120b, the open circuit voltage in first epitaxial layer 120 can be increased. With this, it is possible to suppress a decrease in the open circuit voltage that is caused due to crystalline region 120a.

Furthermore, first epitaxial layer 120 has a density greater than the density of first intermediate layer 121.

With this, in first epitaxial layer 120, it is more likely that crystalline region 120a including an epitaxial growth region is formed. Thus, solar cell 10 according to the present embodiment is capable of maintaining the fill factor at a high level.

Furthermore, a part of at least one of first epitaxial layer 120, first amorphous layer (first intermediate layer 121), and second amorphous layer (first passivation layer 122 and n-type non-crystalline silicon layer 10b) is of a conductivity type identical to the conductivity type of silicon substrate 10d.

With this, in first non-crystalline silicon layer 90 of the conductivity type identical to the conductivity type of silicon substrate 10d, the resistance loss is further reduced, and it is possible to increase the fill factor.

Furthermore, silicon substrate 10d further includes, in a second principal surface opposite to the first principal surface, a texture structure in which a plurality of pyramids are arranged in a matrix. Solar cell 10 further includes second non-crystalline silicon layer 91 formed on the second principal surface of silicon substrate 10d and including recesses and protrusions reflecting the texture structure. At a valley portion in the recesses and protrusions, second non-crystalline silicon layer 91 includes, in the stated order: a second epitaxial layer including crystalline region 120a epitaxially grown on silicon substrate 10d; a third amorphous layer (second intermediate layer) which is a non-crystalline silicon layer on the second epitaxial layer; and a fourth amorphous layer (second passivation layer and p-type non-crystalline silicon layer 10f) which is a non-crystalline silicon layer on the third amorphous layer. The third amorphous layer has a density less than the density of the fourth amorphous layer.

With this, in first non-crystalline silicon layer 90 and second non-crystalline silicon layer 91, it is possible to increase the fill factor while suppressing a decrease in the open circuit voltage.

Furthermore, solar cell module 1 according to the present embodiment includes a plurality of the solar cells described above.

As a result, even when the solar cell has a miniaturized texture structure, solar cell module 1 can include solar cell 10 capable of maintaining a high fill factor and a high open circuit voltage, and thus it is possible to improve the power generation efficiency of solar cell module 1.

Furthermore, a method for manufacturing a solar cell according to the present embodiment includes a non-crystalline layer forming process (S40) in which, on a first principal surface of silicon substrate 10d including a texture structure, first non-crystalline silicon layer 90 including recesses and protrusions reflecting the texture structure is formed by chemical vapor deposition using a raw material gas containing silicon. The non-crystalline layer forming process includes a first epitaxial layer forming process (S41), a first intermediate layer forming process (S42), a first passivation layer forming process (S43), and an n-type non-crystalline silicon layer forming process (S44). In the first epitaxial layer forming process (S41), first epitaxial layer 120 including crystalline region 120a formed on silicon substrate 10d and epitaxially grown is formed. In the first intermediate layer forming process (S42), first intermediate layer 121 which is a non-crystalline silicon layer on first epitaxial layer 120 is formed. In the first passivation layer forming process (S43), first passivation layer 122 which is a non-crystalline silicon layer on first intermediate layer 121 is formed. In the n-type non-crystalline silicon layer forming process (S44), n-type non-crystalline silicon layer 10b which is a non-crystalline silicon layer on first passivation layer 122 is formed. The layer formation speed in the first intermediate layer forming process is greater than the layer formation speed in each of the first passivation layer forming process and the n-type non-crystalline silicon layer forming process.

In the method for manufacturing a solar cell according to the present disclosure, at valley portion 103 in the recesses and protrusions of the first principal surface, first epitaxial layer 120 including epitaxially grown crystalline region 120a, and first intermediate layer 121, first passivation layer 122, and n-type non-crystalline silicon layer 10b each of which is a non-crystalline silicon layer, are formed in this order.

Since first epitaxial layer 120 is formed, the resistance loss in first non-crystalline silicon layer 90 is reduced, and thus the fill factor (FF) of the solar cell increases.

When the layer formation speed in the first intermediate layer forming process is greater than the layer formation speed in each of the first passivation layer forming process and the n-type non-crystalline silicon layer forming process, first intermediate layer 121 is formed without being affected by crystalline region 120a of first epitaxial layer 120. This means that first intermediate layer 121 includes only a non-crystalline region.

First passivation layer 122 is formed on first intermediate layer 121 including only the non-crystalline region; thus, passivation layer 122 is formed without being affected by crystalline region 120a of first epitaxial layer 120. This means that first passivation layer 122 includes only a non-crystalline region.

N-type non-crystalline silicon layer 10b includes only a non-crystalline region as a result of being formed on first passivation layer 122 including only the non-crystalline region.

With this, it is possible to increase the open circuit voltage (Voc) in first non-crystalline silicon layer 90.

Furthermore, the layer formation speed in the first intermediate layer forming process is greater than the layer formation speed in each of the first passivation layer forming process and the n-type non-crystalline silicon layer forming process, and thus first intermediate layer 121 is formed to have a density less than the density of each of first passivation layer 122 and n-type non-crystalline silicon layer 10b. This means that first passivation layer 122 has a high passivation effect and high electrical conductivity. With this, it is possible to suppress a decrease in the fill factor that is caused due to first passivation layer 122 and n-type non-crystalline silicon layer 10b, and it is further possible to increase the open circuit voltage in first non-crystalline silicon layer 90.

Thus, using the method for manufacturing a solar cell according to the present embodiment, it is possible to maintain a high fill factor and a high open circuit voltage even when the solar cell has a miniaturized texture structure.

Furthermore, the layer formation time in the first intermediate layer forming process (S42) is shorter than the layer formation time in each of the first passivation layer forming process (S43) and the n-type non-crystalline silicon layer forming process (S44).

As a result, first intermediate layer 121 is formed to have a thickness less than the thickness of each of first passivation layer 122 and n-type non-crystalline silicon layer 10b. Thus, it is possible to reduce a resistance loss that is caused due to first intermediate layer 121. This means that it is possible to suppress a decrease in the fill factor that is caused due to first intermediate layer 121.

Furthermore, the layer formation speed in the first epitaxial layer forming process (S41) is greater than the layer formation speed in each of the first passivation layer forming process (S43) and the n-type non-crystalline silicon layer forming process (S44) and is less than the layer formation speed in the first intermediate layer forming process (S42).

As a result, in the first epitaxial layer forming process, both crystalline region 120a including the epitaxial growth region and non-crystalline region 120b are formed in first epitaxial layer 120. This means that with non-crystalline region 120b, it is possible to suppress a decrease in the open circuit voltage that is caused due to crystalline region 120a. Thus, using the method for manufacturing a solar cell according to the present embodiment, it is possible to suppress a decrease in the open circuit voltage and maintain the fill factor at a high level.

Embodiment 2

Hereinafter, Embodiment 2 will be described with reference to FIG. 10.

[2-1. Structure of Non-Crystalline Silicon Layer]

Figure 10:
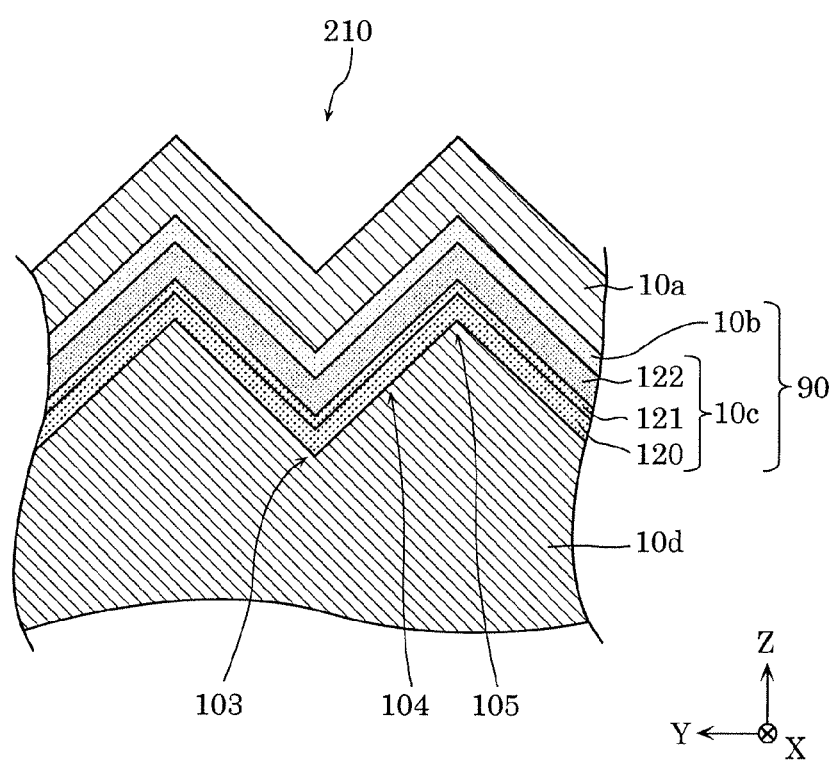
FIG. 10 is an enlarged cross-sectional view of a solar cell according to Embodiment 2.

FIG. 10 is an enlarged cross-sectional view of solar cell 210 according to the present embodiment. Embodiment 1 describes an example in which first epitaxial layer 120, first intermediate layer 121, first passivation layer 122, and n-type non-crystalline silicon layer 10b are formed at valley portion 103. In solar cell 210 according to the present embodiment, in the entire region of first non-crystalline silicon layer 90 including recesses and protrusions reflecting the texture structure formed in silicon substrate 10d, first epitaxial layer 120, first intermediate layer 121, first passivation layer 122, and n-type non-crystalline silicon layer 10b are formed in this order substantially perpendicularly to the first principal surface of silicon substrate 10d. Note that valley portion 103 is included in the entire region of first non-crystalline silicon layer 90. In other words, in each of peak portion 105, valley portion 103, and slant portion 104 connecting peak portion 105 and valley portion 103 in first non-crystalline silicon layer 90 including the recesses and protrusions, first epitaxial layer 120, first intermediate layer 121, first passivation layer 122, and n-type non-crystalline silicon layer 10b are formed in this order.

In the present embodiment, first epitaxial layer 120, first intermediate layer 121, and first passivation layer 122 are formed in i-type non-crystalline silicon layer 10c. Furthermore, a passivation layer is formed in n-type non-crystalline silicon layer 10b. Note that first intermediate layer 121 is one example of the first amorphous layer, and each of first passivation layer 122 and n-type non-crystalline silicon layer 10b is one example of the second amorphous layer.

In solar cell 10 according to Embodiment 1, the fill factor (FF) is adjusted in valley portion 103; in solar cell 210 according to the present embodiment, the fill factor can be adjusted in the entire region of first non-crystalline silicon layer 90. This means that the resistance loss can be reduced to a greater extent than solar cell 10 according to Embodiment 1. Thus, with solar cell 210 according to the present embodiment, it is possible to adjust the fill factor to a higher level.

Furthermore, although FIG. 10 illustrates an example in which first epitaxial layer 120, first intermediate layer 121, first passivation layer 122, and n-type non-crystalline silicon layer 10b are formed to have substantially the same thickness throughout the entire region of the texture structure, this is not limiting. For example, first epitaxial layer 120 may be formed to have a greater thickness at valley portion 103.

Furthermore, although FIG. 10 illustrates the respective layers formed in the entire region of the first principal surface of silicon substrate 10d, the second epitaxial layer, the second intermediate layer, the second passivation layer, and the p-type non-crystalline silicon layer 10f may be formed in the entire region of the second principal surface of silicon substrate 10d. Note that the second epitaxial layer does not need to be formed.

[2-2. Advantageous Effects]

First non-crystalline silicon layer 90 in solar cell 210 according to the present embodiment includes first epitaxial layer 120, the first amorphous layer (first intermediate layer 121), and the second amorphous layer (first passivation layer 122 and n-type non-crystalline silicon layer 10b) in this order in the entire region of the recesses and protrusions including valley portion 103.

With this, the fill factor can be adjusted in the entire region of the first principal surface, and thus it is possible to adjust the fill factor to a higher level.

Other Variations

Although the solar cell, etc., according to the present disclosure have been thus far described based on the embodiments, the present disclosure is not limited to the embodiments described above.

For example, although the foregoing has described an example in which first non-crystalline silicon layer 90 includes n-type non-crystalline silicon layer 10b and i-type non-crystalline silicon layer 10c, this is not limiting. For example, first non-crystalline silicon layer 90 may include only n-type non-crystalline silicon layer 10b. In this case, first epitaxial layer 120, first intermediate layer 121, and first passivation layer 122 are formed in n-type non-crystalline silicon layer 10b. Specifically, by using the same materials to form the layers, but changing the layer formation speed in which n-type non-crystalline silicon layer 10b is formed, first epitaxial layer 120, first intermediate layer 121, and first passivation layer 122 are formed.

Furthermore, although the foregoing has described an example in which non-crystalline silicon layers 90 and 91 formed on the first and second principal surfaces have the same layer structure, this is not limiting. Non-crystalline silicon layers 90 and 91 formed on the first and second principal surfaces may have different layer structures. For example, on the first principal surface, first epitaxial layer 120, first intermediate layer 121, and first passivation layer 122 are formed in i-type non-crystalline silicon layer 10c, and the passivation layer is formed in n-type non-crystalline silicon layer 10b. In contrast, on the second principal surface, the second epitaxial layer and the second intermediate layer may be formed in i-type non-crystalline silicon layer 10e, and the passivation layer may be formed in p-type non-crystalline silicon layer 10f. Other layer structures may be applied.

Furthermore, although solar cell module 1 according to the above embodiment has a configuration in which the plurality of solar cells are arranged in rows and columns on a plane, this is not limiting. For example, it is possible to apply a configuration in which the solar cells are arranged in a circular annular shape or a configuration in which the solar cells are arranged in one-dimensional straight or curved line.

Although the foregoing has described the case where the texture structure is miniaturized, this is not limiting. As the solar cell described above, a solar cell including the texture structure can be used regardless of the size of the texture structure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell, comprising:
a silicon substrate including, in a first principal surface, a texture structure in which a plurality of pyramids are arranged in a matrix; and
a first non-crystalline silicon layer on the first principal surface of the silicon substrate, the first non-crystalline silicon layer including recesses and protrusions reflecting the texture structure, wherein:
at a valley portion in the recesses and protrusions, the first non-crystalline silicon layer includes, in stated order:
a first epitaxial layer including a crystalline region epitaxially grown on the silicon substrate;
a first amorphous layer which is a non-crystalline silicon layer on the first epitaxial layer; and
a second amorphous layer which is a non-crystalline silicon layer on the first amorphous layer,
the first amorphous layer has a density less than a density of the second amorphous layer,
the first amorphous layer and the second amorphous layer are made of a same material and have a same conductivity type, and
the first amorphous layer has a thickness less than a thickness of the second amorphous layer.

2. The solar cell according to claim 1, wherein
the first amorphous layer has a thickness of between 1 nm and 3 nm, inclusive.

3. The solar cell according to claim 1, wherein
the first epitaxial layer further includes a non-crystalline region.

4. The solar cell according to claim 1, wherein
the first epitaxial layer has a density greater than the density of the first amorphous layer.

5. The solar cell according to claim 1, wherein
in an entire region of the recesses and protrusions including the valley portion, the first non-crystalline silicon layer includes the first epitaxial layer, the first amorphous layer, and the second amorphous layer in stated order.

6. The solar cell according to claim 1, wherein
a part of at least one of the first epitaxial layer, the first amorphous layer, and the second amorphous layer is of a conductivity type identical to a conductivity type of the silicon substrate.

7. The solar cell according to claim 1, wherein
the silicon substrate further includes, in a second principal surface opposite to the first principal surface, a texture structure in which a plurality of pyramids are arranged in a matrix,
the solar cell further comprises;
a second non-crystalline silicon layer on the second principal surface of the silicon substrate, the second non-crystalline silicon layer including recesses and protrusions reflecting the texture structure,
at a valley portion in the recesses and protrusions, the second non-crystalline silicon layer includes, in stated order:
a second epitaxial layer including a crystalline region epitaxially grown on the silicon substrate;
a third amorphous layer which is a non-crystalline silicon layer on the second epitaxial layer; and
a fourth amorphous layer which is a non-crystalline silicon layer on the third amorphous layer, and
the third amorphous layer has a density less than a density of the fourth amorphous layer.

8. A solar cell module, comprising:
a plurality of solar cells each of which is the solar cell according to claim 1.

9. The solar cell according to claim 1, wherein
the first amorphous layer does not include the crystalline region.

10. The solar cell according to claim 1, wherein
the first epitaxial layer, the first amorphous layer, and the second amorphous layer are made of the same material.

* * * * *